(12) United States Patent
Binnard

(10) Patent No.: US 7,221,433 B2
(45) Date of Patent: May 22, 2007

(54) STAGE ASSEMBLY INCLUDING A REACTION ASSEMBLY HAVING A CONNECTOR ASSEMBLY

(75) Inventor: Mike Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 14 days.

(21) Appl. No.: 10/767,628

(22) Filed: Jan. 28, 2004

(65) Prior Publication Data

US 2005/0162635 A1     Jul. 28, 2005

(51) Int. Cl.
 G03B 27/58   (2006.01)
 G03B 27/62   (2006.01)
 G03B 27/42   (2006.01)
 H02N 3/00    (2006.01)

(52) U.S. Cl. .......................... 355/72; 355/75; 355/53; 310/10

(58) Field of Classification Search ............... 355/53, 355/72, 77; 250/492.2; 310/10, 12
See application file for complete search history.

(56) References Cited

U.S. PATENT DOCUMENTS

| | | | |
|---|---|---|---|
| 3,855,485 A | 12/1974 | Matsui et al. | |
| 4,166,423 A | 9/1979 | Brienza et al. | |
| 4,243,899 A | 1/1981 | Jaffe | |
| 4,444,492 A | 4/1984 | Lee | |
| 4,460,855 A | 7/1984 | Kelly | |
| 4,482,043 A | 11/1984 | Bauman et al. | |
| 4,625,132 A | 11/1986 | Chitayat | |
| 4,821,205 A | 4/1989 | Schutten et al. | |
| 5,040,431 A * | 8/1991 | Sakino et al. | 74/490.09 |
| 5,138,206 A | 8/1992 | Schmidt | |
| 5,157,296 A | 10/1992 | Trumper | |
| 5,196,754 A | 3/1993 | Berthold et al. | |
| 5,208,497 A | 5/1993 | Ishii et al. | |
| 5,227,839 A | 7/1993 | Allen | |
| 5,255,051 A | 10/1993 | Allen | |
| 5,265,497 A | 11/1993 | Curless | |

(Continued)

FOREIGN PATENT DOCUMENTS

EP     1124160 A2     8/2001

(Continued)

OTHER PUBLICATIONS

U.S. Appl. No. 09/759,524, filed Jan. 16, 2001, Yuan et al.

(Continued)

Primary Examiner—Diane Lee
Assistant Examiner—Kevin Gutierrez
(74) Attorney, Agent, or Firm—Steven G. Roeder; James P. Broder

(57) ABSTRACT

A stage assembly (220) for moving and positioning a device (200) includes a stage base (202), a stage (206), a stage mover assembly (204), and a reaction assembly (226). The stage mover assembly (204) moves the stage (206) relative to the stage base (202). The reaction assembly (226) is coupled to the stage mover assembly (204). The reaction assembly (226) reduces the reaction forces created by the stage mover assembly (204) that are transferred to the stage base (202). In one embodiment, the reaction assembly (226) includes a pair of masses (250A), (250B) and a connector assembly (236) that connects the masses (250A), (250B) together, allows the masses to move independently along a first axis, and causes the masses (250A), (250B) to move concurrently along a second axis.

55 Claims, 15 Drawing Sheets

U.S. PATENT DOCUMENTS

| | | | |
|---|---|---|---|
| 5,280,677 A | 1/1994 | Kubo et al. | |
| 5,294,854 A | 3/1994 | Trumper | |
| 5,338,121 A | 8/1994 | Kobayashi et al. | |
| 5,504,407 A * | 4/1996 | Wakui et al. | 318/568.17 |
| 5,528,118 A | 6/1996 | Lee | |
| 5,677,758 A | 10/1997 | McEachern et al. | |
| 5,699,621 A | 12/1997 | Trumper et al. | |
| 5,777,403 A | 7/1998 | Yuan | |
| 5,783,877 A | 7/1998 | Chitayat | |
| 5,815,246 A | 9/1998 | Sperling et al. | |
| 5,864,389 A | 1/1999 | Osanai et al. | |
| 5,874,820 A | 2/1999 | Lee | |
| 5,959,427 A | 9/1999 | Watson | |
| 5,959,732 A | 9/1999 | Hara et al. | |
| 5,969,441 A | 10/1999 | Loopstra et al. | |
| 5,991,005 A | 11/1999 | Horikawa et al. | |
| 5,996,437 A | 12/1999 | Novak et al. | |
| 5,998,889 A | 12/1999 | Novak | |
| 6,028,376 A | 2/2000 | Osanai et al. | |
| 6,069,417 A | 5/2000 | Yuan et al. | |
| 6,084,319 A | 7/2000 | Kamata et al. | |
| 6,114,781 A | 9/2000 | Hazelton et al. | |
| 6,130,517 A | 10/2000 | Yuan et al. | |
| 6,143,981 A | 11/2000 | Glenn | |
| 6,252,370 B1 | 6/2001 | Ebihara et al. | |
| 6,262,794 B1 | 7/2001 | Miyajima | |
| 6,271,606 B1 | 8/2001 | Hazelton | |
| 6,278,203 B1 | 8/2001 | Novak et al. | |
| 6,281,654 B1 | 8/2001 | Lee | |
| 6,281,655 B1 | 8/2001 | Poon et al. | |
| 6,283,695 B1 | 9/2001 | Nakagawa et al. | |
| 6,304,320 B1 | 10/2001 | Tanaka et al. | |
| 6,322,060 B1 | 11/2001 | Mayama et al. | |
| 6,323,483 B1 | 11/2001 | Cleveland et al. | |
| 6,323,567 B1 | 11/2001 | Hazelton et al. | |
| 6,323,935 B1 | 11/2001 | Ebihara et al. | |
| 6,337,484 B1 | 1/2002 | Loopstra et al. | |
| 6,355,994 B1 | 3/2002 | Andeen et al. | |
| 6,359,679 B1 | 3/2002 | Ito et al. | |
| 6,408,045 B1 | 6/2002 | Matsui et al. | |
| 6,417,914 B1 | 7/2002 | Li | |
| 6,449,030 B1 | 9/2002 | Kwan | |
| 6,525,803 B2 | 2/2003 | Kwan et al. | |
| 6,597,435 B2 * | 7/2003 | Poon et al. | 355/75 |
| 6,724,000 B2 | 4/2004 | Hazelton | |
| 2002/0075469 A1 * | 6/2002 | Tanaka | 355/72 |
| 2003/0067592 A1 * | 4/2003 | Poon et al. | 355/75 |
| 2003/0184724 A1 * | 10/2003 | Ono et al. | 355/72 |
| 2004/0145715 A1 * | 7/2004 | Takashima | 355/72 |

FOREIGN PATENT DOCUMENTS

| | | |
|---|---|---|
| JP | 05-45102 | 8/1989 |
| JP | 06-062786 | 1/1993 |
| JP | 05-262222 | 10/1993 |
| JP | 07-142331 | 6/1995 |
| JP | 10-313566 | 11/1998 |
| JP | 2001-025227 | 1/2001 |
| JP | 2001-275334 | 10/2001 |
| WO | WO 98/28665 | 7/1998 |
| WO | WO 98/40791 | 9/1998 |
| WO | WO 01/47001 A1 | 6/2001 |

OTHER PUBLICATIONS

U.S. Appl. No. 09/721,733, filed Nov. 27, 2000, Nishi.
U.S. Appl. No. 09/139,954, filed Aug. 25, 1998, Teng et al.
Novak, Thomas W, "A New VLSI Printer." SPIE vol. 135 *Developments in Semiconductor Macrolithography III* (1978).

* cited by examiner

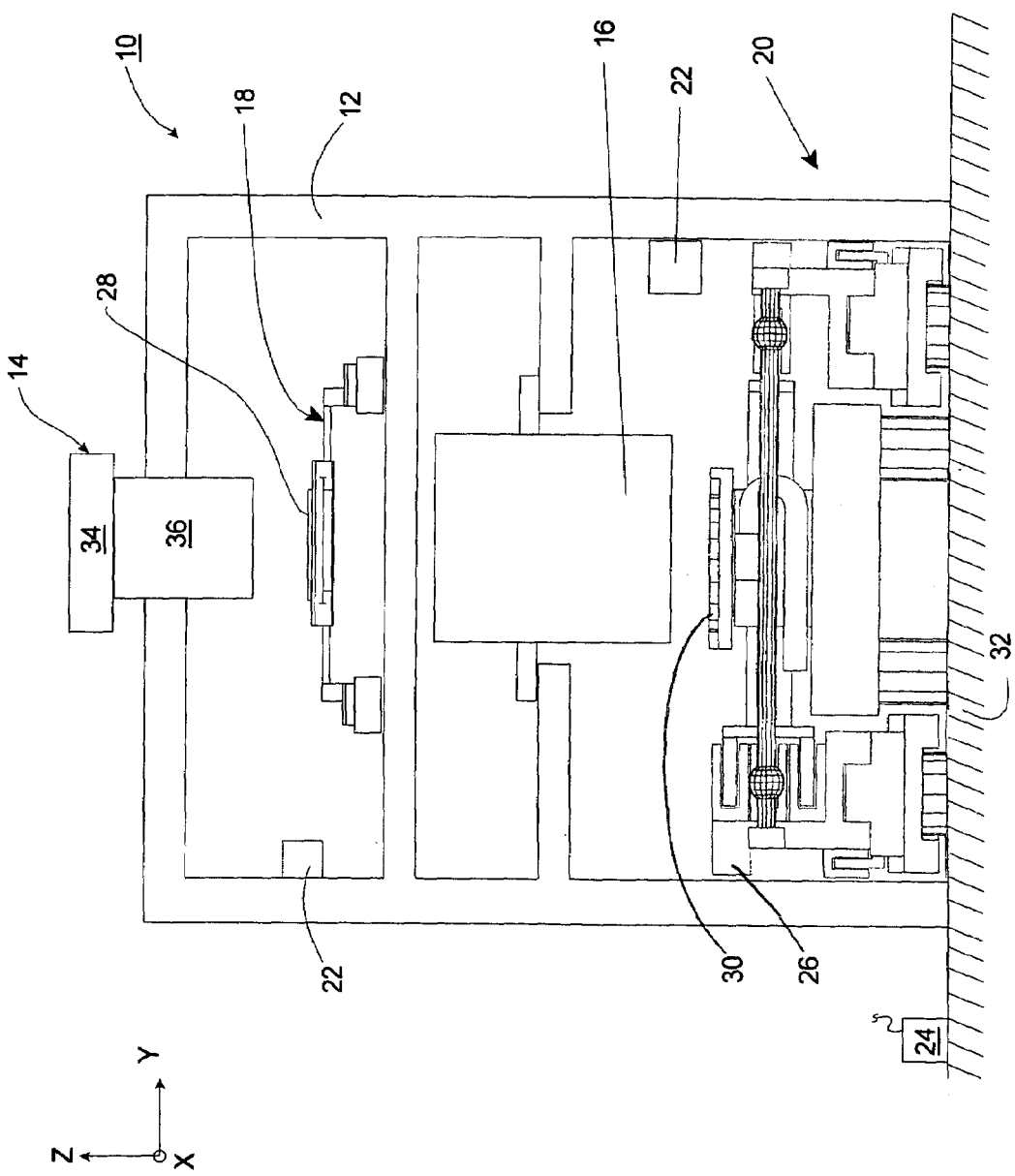

STAGE ASSEMBLY INCLUDING A REACTION ASSEMBLY HAVING A CONNECTOR ASSEMBLY

FIELD OF THE INVENTION

The present invention is directed to a stage assembly for moving a device. More specifically, the present invention is directed to a stage assembly having a reaction assembly including a connector assembly for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, an optical assembly and a wafer stage assembly that retains a semiconductor wafer. The reticle stage assembly and the wafer stage assembly are supported above a ground with an apparatus frame.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images transferred onto the wafer from the reticle is extremely small. Accordingly, the precise relative positioning of the wafer and the reticle is critical to the manufacturing of high density, semiconductor wafers.

Unfortunately, each stage mover assembly generates reaction forces that can vibrate the stage bases and the apparatus frame. The vibration influences the position of the stage bases, the stages, the wafer, and the reticle. As a result thereof, the vibration can cause an alignment error between the reticle and the wafer. This reduces the accuracy of positioning of the wafer relative to the reticle and degrades the accuracy of the exposure apparatus.

SUMMARY

The present invention is directed to a stage assembly for moving a device relative to a stage base. The stage assembly includes a stage, a stage mover assembly, and a reaction assembly. The stage retains the device. The stage mover assembly is connected to the stage and moves the stage relative to the stage base. The reaction assembly is coupled to the stage mover assembly.

A number of embodiments of the reaction assembly are provided herein. In at least one embodiment, the reaction assembly reduces the reaction forces created by the stage mover assembly in at least two degrees of freedom that are transferred to the stage base. As a result thereof, the stage assembly can more accurately position the device. Further, the stage assembly can be used in an exposure apparatus to manufacture high density, high quality semiconductor wafers.

As provided herein, the reaction assembly can include a first subassembly having a first mass, a second subassembly having a second mass and a connector assembly. In one embodiment, the connector assembly connects the masses together, allows for relative movement of the masses with two degrees of freedom, and inhibits relative movement of the masses with one degree of freedom. For example, in one embodiment, the masses move relative to each other along a first axis and the masses move concurrently along a second axis. Additionally, the reaction assembly can also adjust and correct the position of the masses relative to each other about a third axis. With this design, the reaction assembly independently adjusts the position of the masses along the first axis and about the third axis, and concurrently adjusts the position of the masses along the second axis.

The present invention is also directed to an exposure apparatus, a wafer, a device, a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 1 is a schematic illustration of an exposure apparatus having features of the present invention;

DESCRIPTION

Figure 2A:
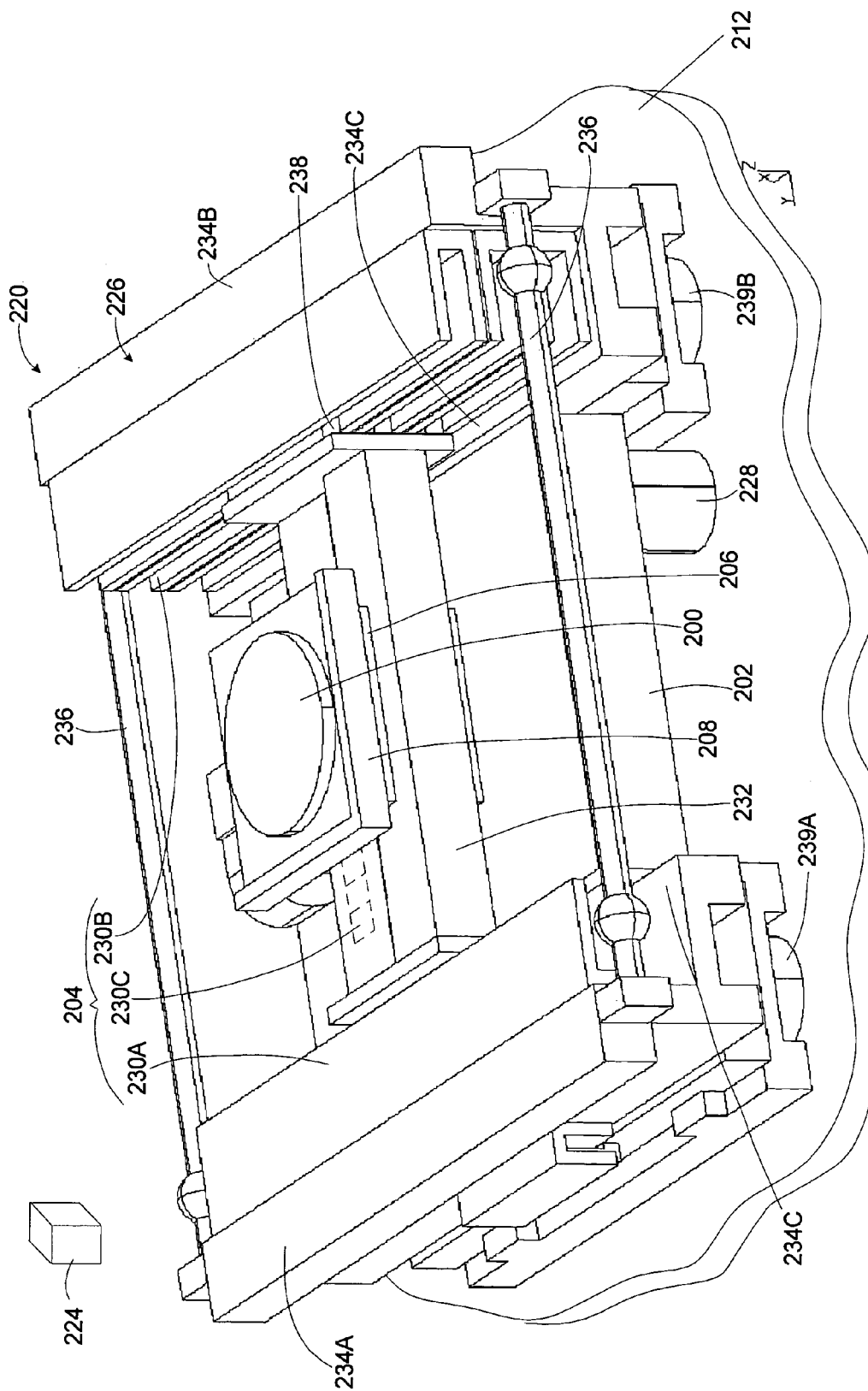
FIG. 2A is a perspective view of a control system and one embodiment of a stage assembly having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10. As provided herein, one or both of the stage assemblies 18, 20 can include a reaction assembly 26 as described below.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 28 onto a semiconductor wafer 30. The exposure apparatus 10 mounts to a mounting base 32, e.g., the ground, a base, or floor or some other supporting structure.

There are a number of different types of lithographic devices. For example, the exposure apparatus 10 can be used as a scanning type photolithography system that exposes the pattern from the reticle 28 onto the wafer 30 with the reticle 28 and the wafer 30 moving synchronously. In a scanning type lithographic device, the reticle 28 is moved perpendicularly to an optical axis of the optical assembly 16 by the reticle stage assembly 18 and the wafer 30 is moved perpendicularly to the optical axis of the optical assembly 16 by the wafer stage assembly 20. Scanning of the reticle 28 and the wafer 30 occurs while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 20 perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 supports the components of the exposure apparatus 10. The apparatus frame 12 illustrated in FIG. 1 supports the reticle stage assembly 18, the wafer stage assembly 20, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 28 and exposes the wafer 30. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 28 to the wafer 30. Depending upon the design of the exposure apparatus 10, the optical assembly 16 can magnify or reduce the image illuminated on the reticle 28. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 28 relative to the optical assembly 16 and the wafer 30. Somewhat similarly, the wafer stage assembly 20 holds and positions the wafer 30 with respect to the projected image of the illuminated portions of the reticle 28.

In photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

The measurement system 22 monitors movement of the reticle 28 and the wafer 30 relative to the optical assembly 16 or some other reference. With this information, the control system 24 can control the reticle stage assembly 18 to precisely position the reticle 28 and the wafer stage assembly 20 to precisely position the wafer 30. For example, the measurement system 22 can utilize multiple laser interferometers, encoders, and/or other measuring devices.

The control system 24 is connected to the reticle stage assembly 18, the wafer stage assembly 20, the measurement system 22, and the reaction assembly 26. The control system 24 receives information from the measurement system 22 and controls the stage mover assemblies 18, 20 to precisely position the reticle 28 and the wafer 30. The control system 24 can also control the reaction assembly 26. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

FIG. 2A is a perspective view of a control system 224, a first embodiment of a stage assembly 220 that is used to position a device 200 and a mounting area 212. The mounting area 212 can be, for example, the apparatus frame 12 (illustrated in FIG. 1) or the mounting base 32 (illustrated in FIG. 1). For example, the stage assembly 220 can be used as the wafer stage assembly 20 in the exposure apparatus 10 of FIG. 1. In this embodiment, the stage assembly 220 would position the wafer 30 (illustrated in FIG. 1) as the device during manufacturing of the semiconductor wafer 30. Alternatively, the stage assembly 220 can be used to move other types of devices 200 during manufacturing and/or inspection, to move a device under an electron microscope (not shown), or to move a device during a precision measurement operation (not shown). For example, the stage assembly 220 could be designed to function as the reticle stage assembly 18 (illustrated in FIG. 1).

In one embodiment, the stage assembly 220 includes a stage base 202, a stage mover assembly 204, a stage 206, a device table 208, and a reaction assembly 226. The design of these components of the stage assembly 220 can be varied. For example, in FIG. 2A, the stage assembly 220 includes one stage 206. Alternatively, however, the stage assembly 220 could be designed to include more than one stage 206.

In FIG. 2A, the stage base 202 is generally rectangular shaped. Alternatively, the stage base 202 can be another shape. The stage base 202 supports some of the components of the stage assembly 220 above the mounting surface of the mounting area 212. The stage base 202 includes a planar base top (sometimes referred to as a guide face), an opposed planar base bottom, and four base sides.

In this embodiment, the stage base 202 is secured with a plurality of spaced apart resilient base isolators 228 (only one is illustrated in FIG. 2A) to the mounting area 212. The base isolators 228 reduce the effect of vibration of the mounting area 212 causing vibration on the stage base 202. Additionally, the base isolators 228 can be used to adjust the position of the stage base 202 relative to the mounting area 212 and the other components of the exposure apparatus 10. Typically, three or four spaced apart base isolators 228 are utilized. Each base isolator 228 can include a pneumatic cylinder (not shown) and an actuator (not shown). Suitable base isolators 228 are sold by Technical Manufacturing Corporation, located in Peabody, Mass., or Newport Corporation located in Irvine, Calif.

The stage mover assembly 204 controls and moves the stage 206 and the device table 208 relative to the stage base 202. For example, the stage mover assembly 204 can move the stage 206 with three degrees of freedom, less than three degrees of freedom, or six degrees of freedom relative to the stage base 202. The stage mover assembly 204 can include one or more movers, such as rotary motors, voice coil motors, linear motors utilizing a Lorentz force to generate drive force, electromagnetic movers, planar motor, or some other force movers.

In FIG. 2A, the stage mover assembly 204 includes a first X mover 230A, a second X mover 230B, a guide bar 232, and a Y mover 230C (illustrated in phantom). The X movers 230A, 230B move the guide bar 232, the stage 206 and the device table 208 with a relatively large displacement along the X axis and with a limited range of motion about the Z axis, and the Y mover 230C moves the stage 206 and the device table 208 with a relatively large displacement along the Y axis relative to the guide bar 232. The design of each mover 230A, 230B, 230C can be varied to suit the movement requirements of the stage assembly 220.

The guide bar 232 guides the movement of the stage 206 along the Y axis. In FIG. 2A, the guide bar 232 is somewhat rectangular beam shaped. A bearing (not shown) maintains the guide bar 232 spaced apart along the Z axis relative to the reaction assembly 226 and allows for motion of the guide bar 232 along the X axis and about the Z axis relative to the reaction assembly 226 and the stage base 202. The bearing can be a vacuum preload type fluid bearing that maintains the guide bar 232 spaced apart from the reaction assembly 226 in a non-contact manner. Alternatively, for example, a magnetic type bearing or a roller type assembly could be utilized that allows for motion of the guide bar 232 relative to the stage base 202.

In FIG. 2A, the stage 206 moves with the guide bar 232 along the X axis and about the Z axis and the stage 206 moves along the Y axis relative to the guide bar 232. A bearing (not shown) maintains the stage 206 spaced apart along the Z axis relative to the stage base 202 and allows for motion of the stage 206 along the X axis, along the Y axis and about the Z axis relative to the stage base 202. The bearing can be a vacuum preload type fluid bearing that maintains the stage 206 spaced apart from the stage base 202 in a non-contact manner. Alternatively, for example, a magnetic type bearing or a roller type assembly could be utilized that allows for motion of the stage 206 relative to the stage base 202.

Further, the stage 206 is maintained apart from the guide bar 232 with bearings (not shown) that allow for motion of the stage 206 along the Y axis relative to the guide bar 232, while inhibiting motion of the stage 206 relative to the guide bar 232 along the X axis and about the Z axis. Each bearing can be a fluid bearing that maintains the stage 206 spaced apart from the guide bar 232 in a non-contact manner. Alternatively, for example, a magnetic type bearing or a roller type assembly or vacuum preload type bearing could be utilized that allows for motion of the stage 206 relative to the guide bar 232.

In the embodiment illustrated in the FIG. 2A, the device table 208 is generally rectangular plate shaped and includes a clamp that retains the device 200. Further, the device table 208 is fixedly secured to the stage 206 and moves concurrently with the stage 206. Alternatively, for example, the stage mover assembly 204 can include a table mover assembly (not shown) that moves and adjusts the position of the device table 208 relative to the stage 206. For example, the table mover assembly can adjust the position of the device table 208 relative to the stage 206 with six degrees of freedom. Alternatively, for example, the table mover assembly can move the device table 208 relative to the stage 206 with only three degrees of freedom.

The reaction assembly 226 reduces the amount of reaction forces from the stage mover assembly 204 that are transferred to the stage base 202 and the mounting area 212. The design of the reaction assembly 226 and the components of the reaction assembly 226 can be varied. Further, a number of embodiments of the reaction assembly 226 are provided herein and discussed below. In at least one embodiment illustrated herein, the reaction assembly 226 reduces reaction forces transferred to the stage base 202 and/or the mounting area 212 along the X axis, along the Y axis and/or about the Z axis. Alternatively, the reaction assembly 226 can be designed to reduce reaction forces in more than three or less than three degrees of freedom. Further, in at least one embodiment, at least a portion and/or all of the reaction assembly 226 is supported relative to the mounting area 212 independently from the stage base 202.

FIG. 2A illustrates a first embodiment of the reaction assembly 226 that reduces the influence of the reaction forces along the X axis, along the Y axis and about the Z axis. In FIG. 2A, the reaction assembly 226 includes a first reaction subassembly 234A, a second reaction subassembly 234B, a connector assembly 236, and a guide connector 238. The reaction subassemblies 234A, 234B each move relative to the mounting area 212 and the stage base 202 with at least one degree of freedom. The connector assembly 236 connects the subassemblies 234A, 234B together. The guide connector 238 couples the guide bar 232 to the second reaction subassembly 234B. With this design, reaction forces from the Y mover 230C are transferred to the second reaction subassembly 234B.

In FIG. 2A, a part of each of the subassemblies 234A, 234B moves independently along the X axis and a part of the subassemblies 234A, 234B move concurrently along the Y axis relative to the stage base 202 and the mounting area 212. Alternatively, the connector assembly 236 can be designed so that the subassemblies 234A, 234B move concurrently along two or more axes.

In this embodiment, when the movers 230A, 230B, 230C apply a force to the stage 206 along the X axis, the Y axis, and/or about the Z axis, an equal and opposite force is applied to the subassemblies 234A, 234B. Further, the control system 224 corrects the positions of a portion of the reaction subassemblies 234A, 234B along the X axis and along the Y axis.

In FIG. 2A, the first reaction subassembly 234A is positioned on one side of the stage base 202 and the second reaction subassembly 234B is positioned on the opposite side of the stage base 202. The reaction subassemblies 234A, 234B are spaced apart and substantially parallel. Additionally, each reaction subassembly 234A, 234B includes a guide surface 234C that guides the motion of and supports the guide bar 232.

In this embodiment, the first reaction subassembly 234A is secured with a plurality of spaced apart first subassembly adjusters 239A (only one is illustrated in FIG. 2A) to the mounting area 212 and the second reaction subassembly 234B is secured with a plurality of spaced apart second subassembly adjusters 239B (only one is illustrated in FIG. 2A) to the mounting area 212. The subassembly adjusters 239A, 239B reduce the effect of vibration of each reaction subassembly 234A, 234B on the mounting area 212. Additionally, the first subassembly adjusters 239A can be used to adjust the position of the first reaction subassembly 234A along the Z axis, about the X axis and about the Y axis relative to the second reaction subassembly 234B, the stage base 202, the mounting area 212, and the other components of the exposure apparatus 10. Similarly, the second subassembly adjusters 239B can be used to adjust the position of the second reaction subassembly 234B along the Z axis, about the X axis and about the Y axis relative to the first reaction subassembly 234A, the stage base 202, the mounting area 212, and the other components of the exposure apparatus 10. With this design, for example, the control system 224 can adjust the position of the reaction subassemblies 234A, 234B to follow the stage base 202.

Typically, two to four spaced apart subassembly adjusters 239A, 239B are utilized. Each subassembly adjuster 239A, 239B can include a pneumatic cylinder (not shown) and an actuator (not shown). Suitable subassembly adjusters 239A, 239B are sold by Technical Manufacturing Corporation, located in Peabody, Mass., or Newport Corporation located in Irvine, Calif.

Figure 2B:
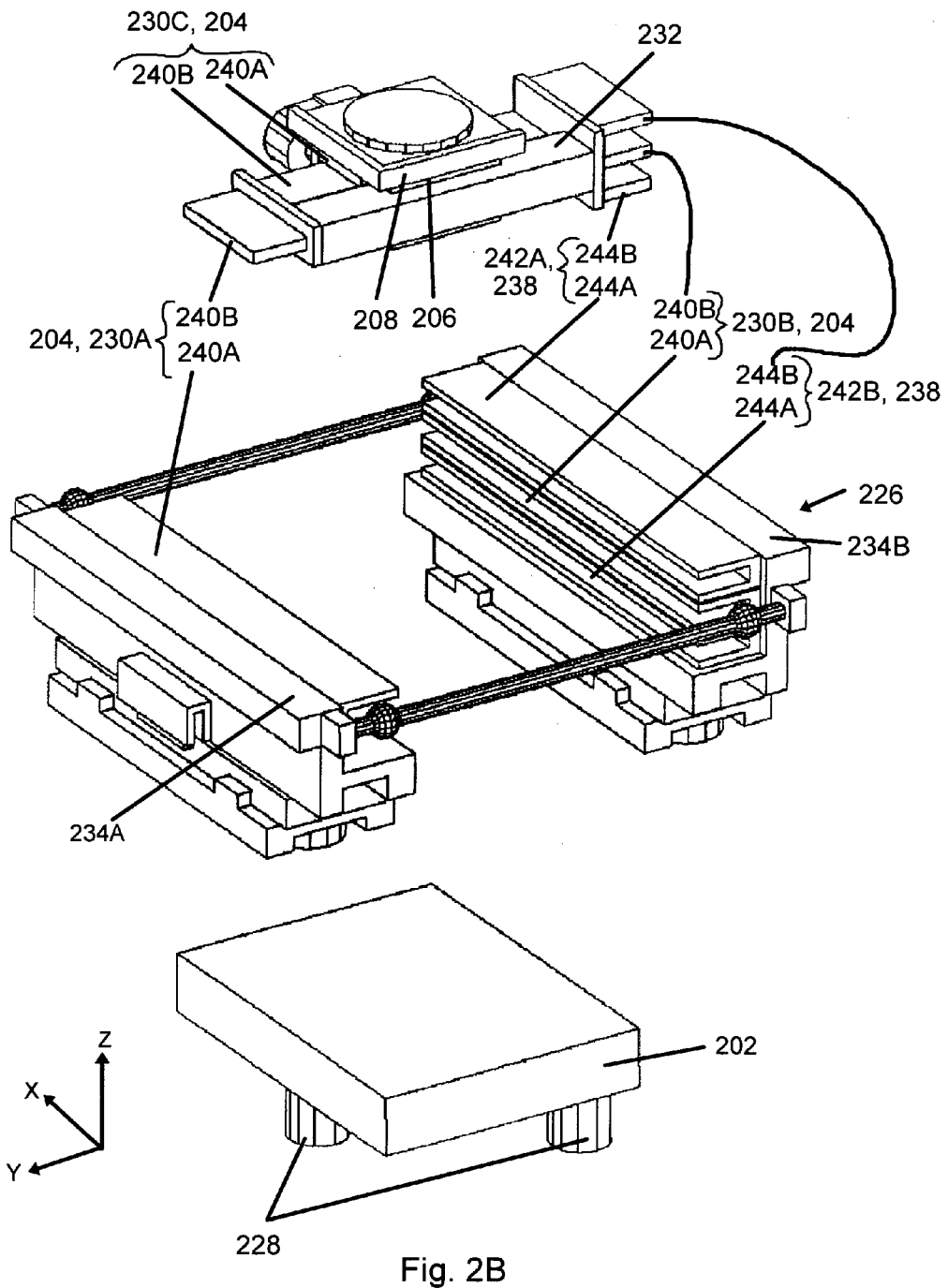
FIG. 2B is an exploded perspective view of the stage assembly of FIG. 2A.

FIG. 2B is an exploded perspective view of the stage assembly 220 of FIG. 2A, including the stage base 202, the stage mover assembly 204, the stage 206, the device table 208, and the reaction assembly 226 of FIG. 2A.

In this embodiment, each mover 230A, 230B, 230C includes a first mover component 240A and a spaced apart, adjacent second mover component 240B that interacts with the first mover component 240A. In FIG. 2B, one of the components 240A, 240B includes one or more magnet arrays (not shown) and the other component 240B, 240A includes one or more conductor arrays (not shown). The design of each magnet array and the number of magnets in each magnet array can be varied. Each magnet can be made of a permanent magnetic material such as NdFeB. The design of each conductor array and the number of conductors in each conductor array is varied. Each conductor can be made of metal such as copper or any substance or material responsive to electrical current and capable of creating a magnetic field, such as superconductors.

Electrical current (not shown) is individually supplied to each conductor in each conductor array by the control system 224 (illustrated in FIG. 2A). For each mover 203A, 230B, 230C the electrical current in each conductor interacts with a magnetic field (not shown) generated by one or more of the magnets in the magnet array. This causes a force (Lorentz force) between the conductors and the magnets that can be used to move the stage 206 relative to the stage base 202.

Specifically, the first mover component 240A and the second component 240B of each X mover 230A, 230B interact to selectively move the stage 206 along the X axis and about the Z axis relative to the stage base 202. In the embodiment illustrated in the FIG. 2B, each X mover 230A, 230B is a commutated, linear motor.

In FIG. 2B, for the first X mover 230A, the first mover component 240A is fixedly secured to the first reaction subassembly 234A while the second mover component 240B is fixedly secured to one end of the guide bar 232. Similarly, for the second X mover 230B, the first mover component 240A is fixedly secured to the second reaction subassembly 234B while the second mover component 240B is fixedly secured to the other end of the guide bar 232. In this embodiment, the first mover component 240A of each X mover 230A, 230B includes a pair of spaced apart magnet arrays and the second mover component 240B includes a conductor array. Alternatively, for example, the first mover component 240A of each X mover 230A, 230B can include a conductor array (not shown) while the second mover component 240B of each X mover 230A, 230B can include a pair of spaced apart magnet arrays (not shown).

With this design, reaction forces generated by the first X mover 230A are directly transferred to the first reaction subassembly 234A and reaction forces generated by the second X mover 230B are directly transferred to the second reaction subassembly 234B. For example, when the first X mover 230A applies a force to the stage 206 along the X axis, an equal and opposite force along the X axis is directly transferred to the first reaction subassembly 234A. Similarly, when the second X mover 230B applies a force to the stage 206 along the X axis an equal and opposite force along the X axis is directly transferred to the second reaction subassembly 234B.

The first mover component 240A and the second component 240B of the Y mover 230C interact to selectively move the stage 206 along the Y axis relative to the guide bar 232 and the stage base 202. In the embodiment illustrated in the FIG. 2B, the Y mover 230C is a commutated, linear motor. In FIG. 2B, for the Y mover 230C, the first mover component 240A is fixedly secured to the stage 206 while the second mover component 240B is fixedly secured to the guide bar 232. In this embodiment, the first mover component 240A includes a pair of spaced apart magnet arrays and the second mover component 240B includes a conductor array. Alternatively, for example, the first mover component 240A can include a conductor array (not shown) while the second mover component 240B of the Y mover 230C can include a pair of spaced apart magnet arrays (not shown).

The guide connector 238 connects and couples the guide bar 232 to the reaction assembly 226 and allows for relative movement between the guide bar 232 and the reaction assembly 226. In one embodiment, the guide connector 238 connects and couples the guide bar 232 to the reaction assembly 226 and inhibits motion along the Y axis and allows for relative movement between the guide bar 232 and the reaction assembly 226 along the X axis. The design of the guide connector 238 can vary. In FIG. 2B, the guide connector 238 includes a first connector motor 242A and a second connector motor 242B that cooperate to couple the guide bar 232 to the second reaction subassembly 234B. In this embodiment, the first connector motor 242A is positioned above the second X mover 230B and the second connector motor 242B is positioned below the second X mover 230B.

In this embodiment, each connector motor 242A, 242B is a voice coil motor that includes a relatively long first motor component 244A and a spaced apart, adjacent second motor component 244B that interacts with the first motor component 244A. In FIG. 2B, one of the components 244A, 244B includes one or more magnet arrays and the other component 244B, 244A includes one or more conductor arrays.

Electrical current (not shown) is individually supplied to each conductor in each conductor array by the control system 224 (illustrated in FIG. 2A). For each connector motor 242A, 242B, the electrical current in each conductor interacts with a magnetic field generated by one or more of the magnets in the magnet array. This causes a force (Lorentz force) between the conductors and the magnets that can be used to connect the guide bar 232 to the second reaction subassembly 234B.

In FIG. 2B, for each connector motor 242A, 242B, the first motor component 244A is fixedly secured to the second reaction subassembly 234B while the second motor component 244B is fixedly secured to one end of the guide bar 232. In this embodiment, the first motor component 244A includes a pair of spaced apart magnet arrays and the second mover component 244B includes a conductor array. Alternatively, for example, the first mover component 244A can include a conductor array (not shown) while the second mover component 244B can include a pair of spaced apart magnet arrays (not shown).

With this design, reaction forces generated by the Y mover 230C are transferred to the guide bar 232 and the second reaction subassembly 234B via the guide connector 238. For example, when the Y mover 230C applies a force to the stage 206 along the Y axis, and equal and opposite force along the Y axis is directly transferred to the guide bar 232 and transferred with the guide connector 238 to the second reaction subassembly 234B.

Alternatively, for example, the first motor component could be relatively short and can be moved with a linear motor (not shown) along the X axis. Still alternatively, a mechanical type connector, such as an air bearing or roller bearing assembly, can be used to connect the guide bar 232 to the second reaction subassembly 234B.

Figure 2C:
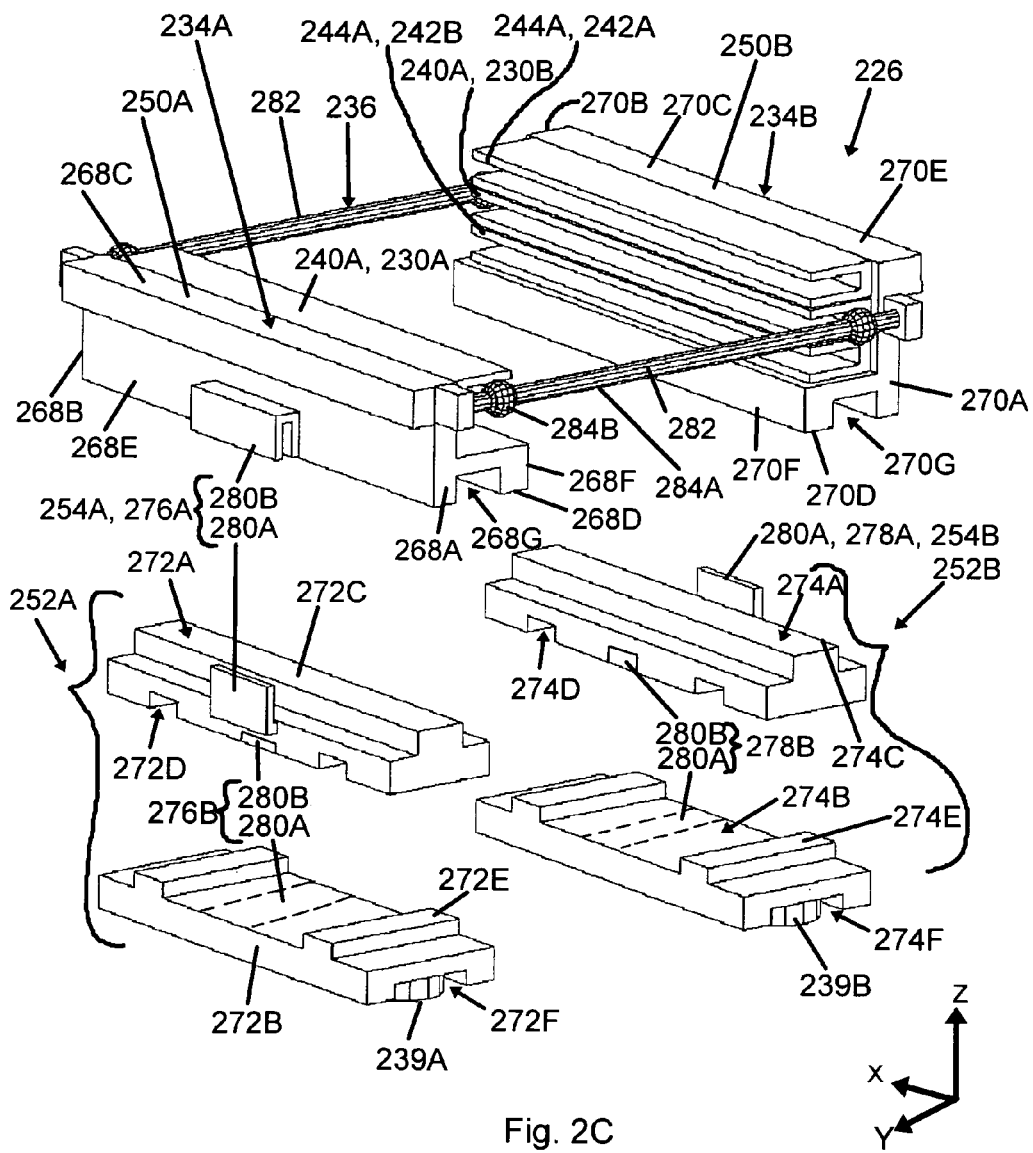
FIG. 2C is an exploded perspective view of a reaction assembly of the stage assembly of FIG. 2A.

FIG. 2C is an exploded perspective view of the reaction assembly 226 of FIG. 2A, including the first reaction subassembly 234A, the second reaction subassembly 234B, and the connector assembly 236. In this embodiment, the first reaction subassembly 234A includes a first mass 250A, a first mass support 252A, and a first trim assembly 254A. Similarly, the second reaction subassembly 234B includes a second mass 250B, a second mass support 252B, and a second trim assembly 254B.

In FIG. 2C, the first mass 250A includes a first end 268A, an opposed second end 268B, a top side 268C, an opposed bottom side 268D, an outer side 268E and an opposed inner side 268F. In this embodiment, the first mover component 240A of the first X mover 230A is fixedly secured to the inner side 268F. Additionally, the first mass 250A includes a first follower 268G that engages the first mass support 252A. In this embodiment, the first follower 268G is a rectangular shaped channel that extends along the X axis in the bottom side 268D.

Similarly, the second mass 250B includes a first end 270A, an opposed second end 270B, a top side 270C, an opposed bottom side 270D, an outer side 270E and an opposed inner side 270F. In this embodiment, the first mover component 240A of the second X mover 230B and the first motor component 244A of the connector motors 242A, 242B are fixedly secured to the inner side 270F. Additionally, the second mass 250B includes a second follower 270G that engages the second mass support 252B. In this embodiment, the second follower 270G is a rectangular shaped channel that extends along the X axis in the bottom side 270D.

In one embodiment, the ratio of the mass of the masses 250A, 250B to the mass of the stage 206 (illustrated in FIG. 2B) is relatively high. This will minimize the movement of the masses 250A, 250B and minimize the required travel of the trim assemblies 254A, 254B. A suitable ratio of the mass of the masses 250A, 250B to the mass of the stage 206 is between approximately 2:1 and 10:1. A larger mass ratio is better, but is limited by the physical size of the reaction assembly 226.

The first mass support 252A supports the first mass 250A relative to the mounting area 212 (illustrated in FIG. 2A) and allows for motion of the first mass 250A relative to the mounting area 212 and the stage base 202 (illustrated in FIG. 2A) along the X axis and along the Y axis. Somewhat similarly, second mass support 252B supports the second mass 250B relative to the mounting area 212 and allows for motion of the second mass 250B relative to the mounting area 212 and the stage base 202 along the X axis and along the Y axis.

In one embodiment, the first mass support 252A includes a first X guide 272A and a first Y guide 272B. The first X guide 272A supports the first mass 250A, allows the first mass 250A to move along the X axis, and restricts movement of the first mass 250A relative to the first X guide 272A along the Y and Z axes and about the X, Y and Z axes. In FIG. 2C, the first X guide 272A includes a follower guide 272C that interacts with the first follower 268G. In this embodiment, the follower guide 272C is a rectangular shaped protrusion in the top of the first X guide 272A. Additionally, the first X guide 272A includes a Y follower 272D that engages the first Y guide 272B. In one embodiment, the Y follower 272D is a pair of spaced apart rectangular shaped channels that extend along the Y axis transversely to the first X guide 272A.

A bearing (not shown) allows for motion of the first mass 250A relative to the first X guide 272A along the X axis. The bearing can be a vacuum preload type fluid bearing, magnetic type bearing, or a roller type bearing assembly.

The first Y guide 272B supports the first mass 250A and the first X guide 272A, allows the first mass 250A and the first X guide 272A to move concurrently along the Y axis, and restricts movement of the first X guide 272A relative to the first Y guide 272B along the X and Z axes and about the X, Y and Z axes. In FIG. 2C, the first Y guide 272B includes a Y follower guide 272E that interacts with the Y follower 272D. In one embodiment, the Y follower guide 272E is a pair of spaced apart rectangular shaped protrusions in the top of the first Y guide 272B that extend along the Y axis transversely to the first Y guide 272B. Additionally, the first Y guide 272B includes a bottom channel 272F. The first subassembly adjusters 239A are secured to the bottom of the first Y guide 272B.

A bearing (not shown) allows for motion of the first X guide 272A and the first mass 250A relative to the first Y guide 272B. The bearing can be a vacuum preload type fluid bearing, magnetic type bearing, or a roller type bearing assembly.

Similarly, in one embodiment, the second mass support 252B includes a second X guide 274A and a second Y guide 274B. The second X guide 274A supports the second mass 250B, allows the second mass 250B to move along the X axis, and restricts movement of the second mass 250B relative to the second X guide 274A along the Y and Z axes and about the X, Y and Z axes. In FIG. 2C, the second X guide 274A includes a follower guide 274C that interacts with the second follower 270G. In this embodiment, the follower guide 274C is a rectangular shaped protrusion in the top of the second X guide 274A. Additionally, the second X guide 274A includes a Y follower 274D that engages the second Y guide 274B. In one embodiment, the Y follower 274D is a pair of spaced apart rectangular shaped channels that extend along the Y axis transversely to the second X guide 274A.

A bearing (not shown) allows for motion of the second mass 250B relative to the second X guide 274A. The bearing can be a vacuum preload type fluid bearing, magnetic type bearing, or a roller type bearing assembly.

The second Y guide 274B supports the second mass 250B and the second X guide 274A, allows the second mass 250B and the second X guide 274A to move concurrently along the Y axis, and restricts movement of the second X guide 274A relative to the second Y guide 274B along the X and Z axes and about the X, Y and Z axes. In FIG. 2C, the second Y guide 274B includes a Y follower guide 274E that interacts with the Y follower 274D. In this embodiment, the Y follower guide 274E is a pair of spaced apart rectangular shaped protrusions in the top of the second Y guide 274B that extend along the Y axis transversely to the second Y guide 274B. Additionally, the second Y guide 274B includes a bottom channel 274F. The second subassembly adjusters 239B are secured to the bottom of the second Y guide 274B.

A bearing (not shown) allows for motion of the second X guide 274A and the second mass 250B relative to the second Y guide 274B. The bearing can be a vacuum preload type fluid bearing, magnetic type bearing, or a roller type bearing assembly.

The first trim assembly 254A adjusts and/or resets the position of the first mass 250A along the X axis and the Y axis, cancels any positional errors of the first mass 250A and/or cancels any steady-state velocity of the first mass 250A. Somewhat similarly, the second trim assembly 254B adjusts and/or resets the position of the second mass 250B along the X axis and the Y axis, cancels any positional errors of the second mass 250B and/or cancels any steady-state velocity of the second mass 250B.

The design of each of trim assembly 254A, 254B can vary. In FIG. 2C, the first trim assembly 254A includes a first X trim mover 276A and a first Y trim mover 276B, and the second trim assembly 254B includes a second X trim mover 278A and a second Y trim mover 278B. In this embodiment, (i) the first X trim mover 276A adjusts the position of first mass 250A relative to the first X guide 272A along the X axis, (ii) the first Y trim mover 276B adjusts the position of the first mass 250A and the first X guide 272A relative to the first Y guide 272B along the Y axis, (iii) the second X trim mover 278A adjusts the position of second mass 250B relative to the second X guide 274A along the X axis, and (iv) the second Y trim mover 278B adjusts the position of the second mass 250B and the second X guide 274A relative to the second Y guide 274B along the Y axis.

Each of the trim movers 276A, 276B, 278A, 278B can be a rotary motor, a voice coil motor, a linear motor, an electromagnetic actuator, and/or another type of force actuator. In the embodiment illustrated in FIG. 2C, each trim movers 276A, 276B, 278A, 278B is a linear motor that includes a stator component 280A and a moving component 280B. In the embodiments provided herein, one of the components 280A, 280B includes one or more magnet arrays and the other component 280B, 280A includes one or more conductor arrays. Electrical current (not shown) is individually supplied to each conductor array by the control system 224 (illustrated in FIG. 2A). For each trim movers 276A, 276B, 278A, 278B, the electrical current in each conductor interacts with a magnetic field (not shown) generated by one or more of the magnets in the magnet array. This causes a force (Lorentz force) between the conductors and the magnets. With this design, the control system 224 directs current to the trim movers 276A, 276B, 278A, 278B to control the positions of the masses 250A, 250B and the X guides 272A, 274A.

In one embodiment, the trim movers 276A, 276B, 278A, 278B include a measurement device (not shown) such as an encoder that provides information regarding position.

The connector assembly 236 mechanically connects and couples the reaction subassemblies 234A, 234B and simplifies the connection between the reaction subassemblies 234A, 234B. In one embodiment, the connector assembly 236 allows for relative motion of at least a portion of the reaction subassemblies 234A, 234B with at least two degrees of freedom and inhibits relative motion of at least a portion of the reaction subassemblies 234A, 234B with at least one degree of freedom. For example, in one embodiment, the connector assembly 236 allows for relative motion of the masses 250A, 250B along the Z axis, along the X axis, about the X axis, about the Y axis, and about the Z axis and inhibits relative motion of the masses 250A, 250B and the X guides 272A, 274A along the Y axis.

In FIG. 2C, the connector assembly 236 includes a pair of spaced apart connectors 282 that directly connect the opposite ends of the masses 250A, 250B together. In one embodiment, each connector 282 is a link that is relatively stiff along one degree of freedom and relatively flexible with five degrees of freedom. In this embodiment, each connector 282 includes a rigid bar 284A and a pair of spaced apart joints 284B, e.g. flexures, ball joints, and/or hinges, that allow for motion with five degrees (along the Z axis, along the X axis, about the X axis, about the Y axis, and about the Z axis) of freedom. Alternatively, for example, the connector assembly 236 can include more than two or less than two connectors 282, or each connector 282 can be a stiff rod. Still alternatively, for example, each connector 282 can utilize electromagnetic means. In one embodiment, the connectors 282 are at approximately the same position along the Z axis as the masses 250A, 250B and the stage 206.

Figure 2D:
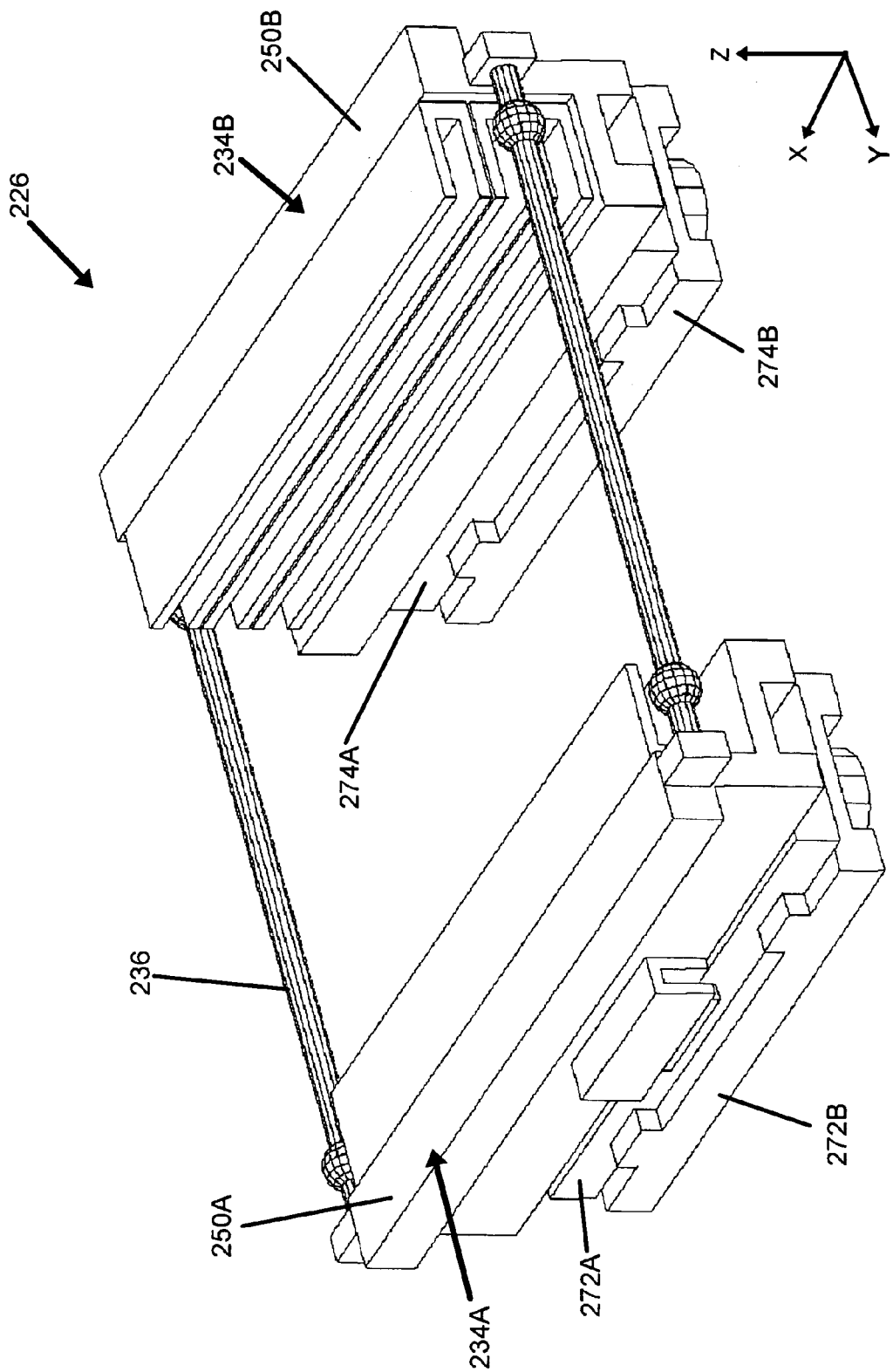
FIG. 2D is a perspective view of the reaction assembly of FIG. 2C.

FIG. 2D is a perspective view of the reaction assembly 226 including the first reaction subassembly 234A, the second reaction subassembly 234B and the connector assembly 236. Through the principle of conservation of momentum, movement of the stage 206 (illustrated in FIG. 2A) and guide bar 232 (illustrated in FIG. 2A) with the X movers 230A, 230B (illustrated in FIG. 2A) along the X axis in one direction, generates an equal but opposite X reaction force that moves the masses 250A, 250B relative to the respective X guides 272A, 274A in the opposite direction along the X axis. Movement of the stage 206 with the Y mover 230C (illustrated in FIG. 2A) along the Y axis in one direction creates an equal but opposite Y reaction force on the second mass 250B along the Y axis that moves the masses 250A, 250B and the X guides 272A, 274A along the Y axis relative to the Y guides 272B, 274B. Additionally, movement of the stage 206 about the Z axis with the X movers 230A, 230B can generate a theta Z reaction force (torque) about the Z axis in the opposite direction that moves the masses 250A, 250B independently relative to the respective X guides 272A, 274A.

It should be noted in this embodiment, that the masses 250A, 250B move independently along the X axis and that the masses 250A, 250B and the X guides 272A, 274A move concurrently along the Y axis.

Figure 3A:
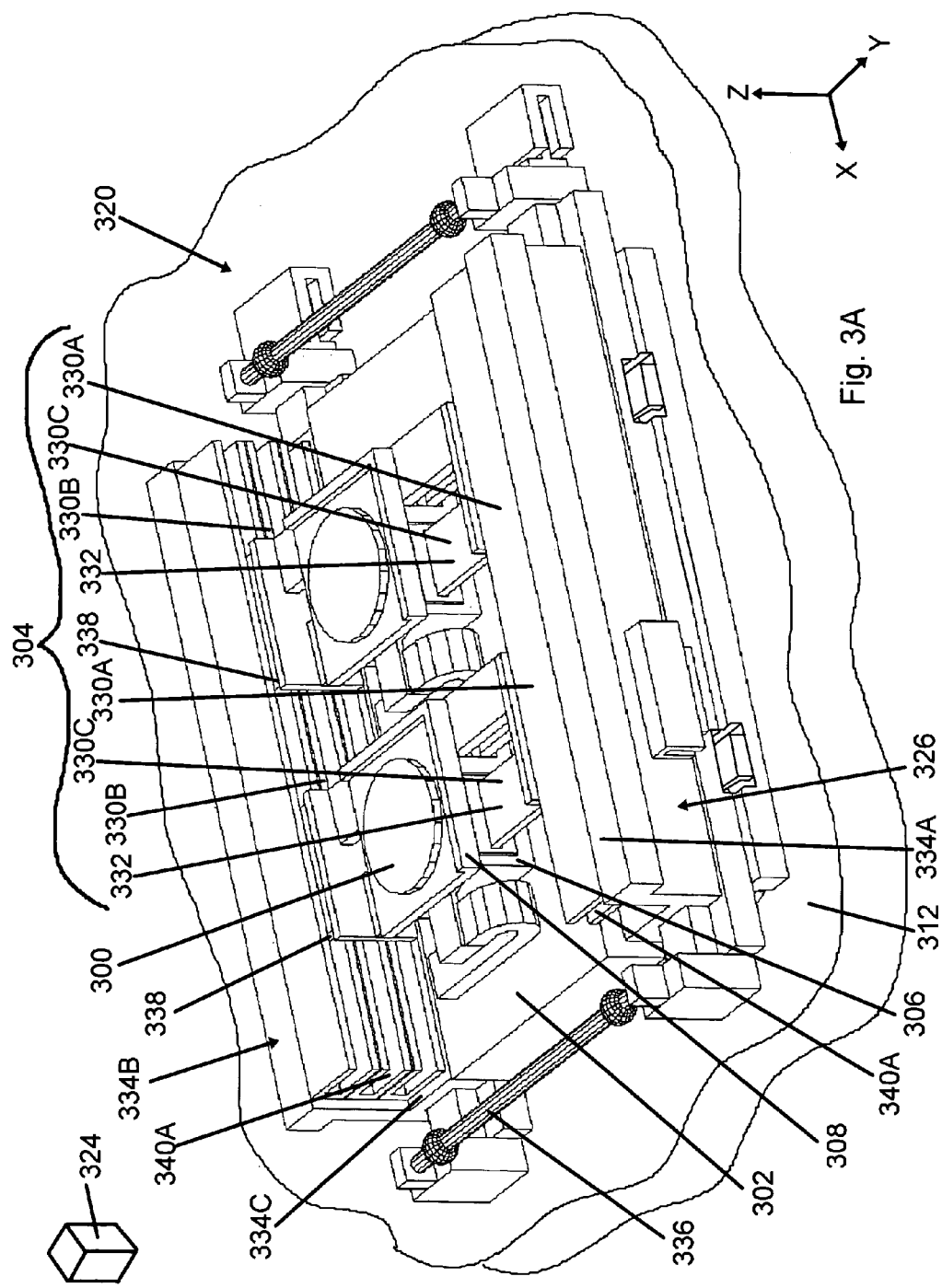
FIG. 3A is a perspective view of a control system and another embodiment of a stage assembly having features of the present invention.

FIG. 3A is a perspective view of a control system 324, and another embodiment of a stage assembly 320 that is used to position a device 300 relative to a mounting area 312. For example, the stage assembly 320 can be used as the wafer stage assembly 20 in the exposure apparatus 10 of FIG. 1. Alternatively, the stage assembly 320 can be used to move other types of devices 300 during manufacturing and/or inspection, to move a device under an electron microscope (not shown), or to move a device during a precision measurement operation (not shown).

In FIG. 3A, the stage assembly 320 includes a stage base 302, a stage mover assembly 304, two stages 306, two device tables 308, and a reaction assembly 326. In this embodiment, the stage base 302, the stages 306 and the device tables 308 are similar to the corresponding components described above. However, in this embodiment, the stage mover assembly 304 and the reaction assembly 326 are slightly different than the corresponding components described above.

The stage mover assembly 304 controls and individually moves the stages 306 and the device tables 308 relative to the stage base 302. For example, the stage mover assembly 304 can independently move each stage 306 with three degrees of freedom, less than three degrees of freedom, or more than three degrees of freedom relative to the stage base 302.

In FIG. 3A, the stage mover assembly 304 includes two, first X movers 330A, two second X movers 330B, two guide bars 332, and two Y movers 330C (illustrated in phantom) that are somewhat similar to the corresponding components described above. However, in this embodiment, the first X movers 330A share the same first mover component 340A of the first X mover 330A that is secured to the reaction assembly 326 and the second X movers 330B share the same first mover component 340A of the second X mover 330B that is secured to the reaction assembly 326.

FIG. 3A illustrates another embodiment of the reaction assembly 326 that reduces the influence of the reaction forces along the X axis, along the Y axis and about the Z axis. In FIG. 3A, the reaction assembly 326 includes a first reaction subassembly 334A, a second reaction subassembly 334B, a connector assembly 336, and two guide connectors 338. The reaction subassemblies 334A, 334B each move relative to the mounting area 312 and the stage base 302 with at least one degree of freedom. The connector assembly 336 connects the subassemblies 334A, 334B together. Each guide connector 338 couples one guide bar 332 to the second reaction subassembly 334B. With this design, reaction forces from the Y movers 330C are transferred to the second reaction subassembly 334B.

In FIG. 3A, a part of each of the subassemblies 334A, 334B moves independently along the X axis and a part of the subassemblies 334A, 334B move concurrently along the Y axis relative to the stage base 302 and the mounting area 312.

In this embodiment, when the movers 330A, 330B, 330C apply a force to one or both of the stages 306 along the X axis, the Y axis, and/or about the Z axis, an equal and opposite force is applied to the subassemblies 334A, 334B. Further, the control system 324 corrects the positions of a portion of the reaction subassemblies 334A, 334B along the X axis, along the Y axis, and/or about the Z axis.

In this embodiment, the first reaction subassembly 334A is positioned on one side of the stage base 302 and the second reaction subassembly 334B is positioned on the opposite side of the stage base 302. The reaction subassemblies 334A, 334B are spaced apart and substantially parallel. Additionally, each reaction subassembly 334A, 334B includes a guide surface 334C that guides the motion of and supports the guide bars 332.

Figure 3B:
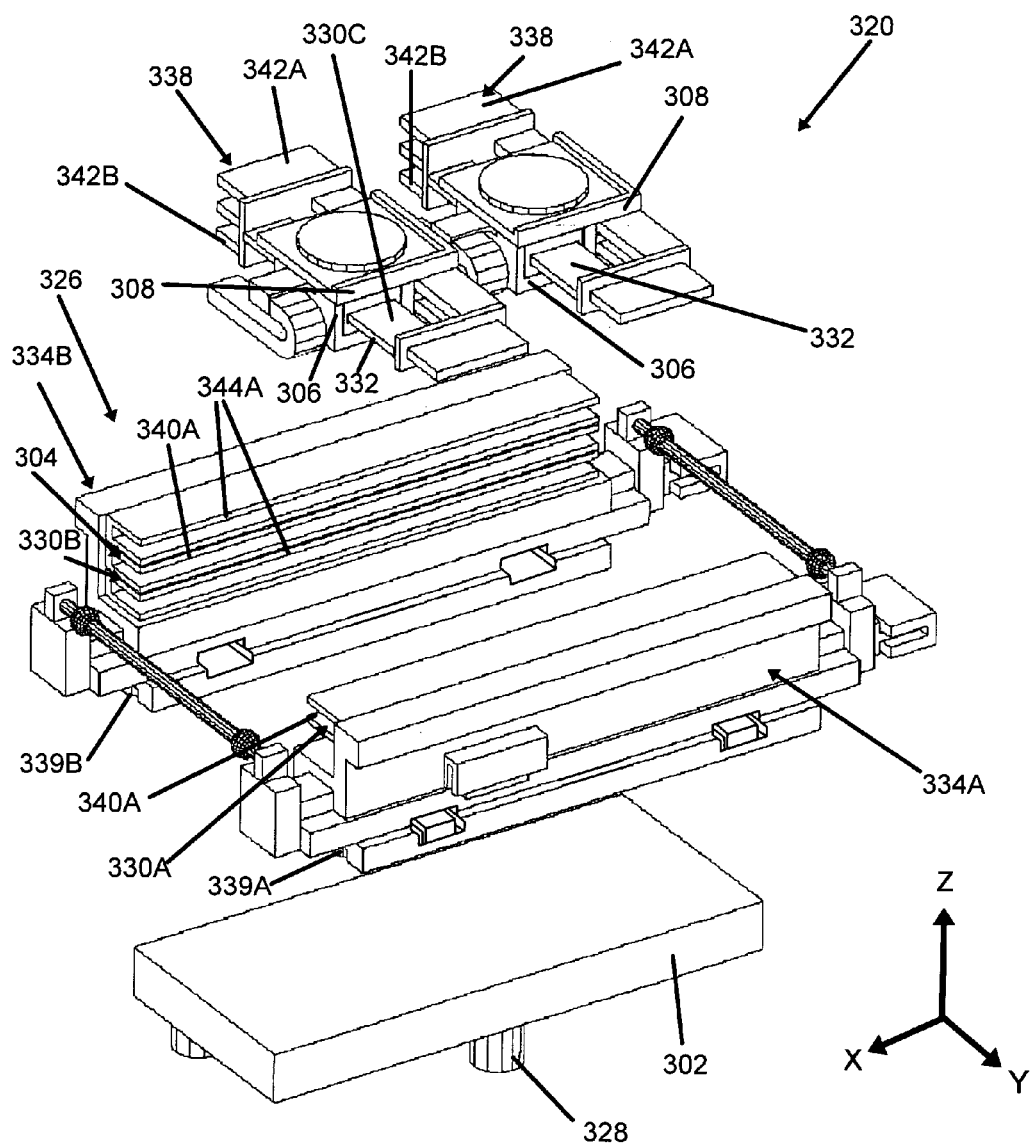
FIG. 3B is an exploded perspective view of the stage assembly of FIG. 3A.

FIG. 3B is an exploded perspective view of the stage assembly 320 of FIG. 3A, including the stage base 302, the stage mover assembly 304, the stages 306, the device tables 308, and the reaction assembly 326 of FIG. 2A. In this embodiment, the stage base 302 is secured with base isolators 328 to the mounting area 312 (illustrated in FIG. 3A), the first reaction subassembly 334A is secured with a first subassembly adjusters 339A to the mounting area 312 and the second reaction subassembly 334B is secured with second subassembly adjusters 339B to the mounting area 312. With this design, the position of the stage base 302 and the reaction subassemblies 334A, 334B can be independently adjusted relative to the mounting area 312 and each other.

In FIG. 3B, the first mover component 340A for the first X movers 330A is fixedly secured to the first reaction subassembly 334A and the first mover component 340A for the second X movers 330B is fixedly secured to the second reaction subassembly 334B. With this design, reaction forces generated by the first X movers 330A are directly transferred to the first reaction subassembly 334A and reaction forces generated by the second X movers 330B are directly transferred to the second reaction subassembly 334B. For example, when one or both of the first X movers 330A applies a force to the stage 306 along the X axis, an equal and opposite force along the X axis is directly transferred to the first reaction subassembly 334A. Similarly, when one or both of the second X movers 330B applies a force to the stage 306 along the X axis, an equal and opposite force along the X axis is directly transferred to the second reaction subassembly 334B.

Each guide connector 338 connects and couples one of the guide bars 332 to the reaction assembly 326 and allows for relative movement between the guide bars 332 and the reaction assembly 326. In FIG. 3B, each guide connector 338 includes a first connector motor 342A and a second connector motor 342B that cooperate to couple the guide bars 332 to the second reaction subassembly 334B. In this embodiment, each connector motor 342A, 342B is similar to the corresponding component described above. However, in this embodiment, the first connector motors 342A share the same first motor component 344A that is secured to the second reaction subassembly 334B and the second connector motors 342B share the same first motor component 344A that is secured to the second reaction subassembly 334B.

With this design, reaction forces generated by the Y movers 330C are transferred to the guide bars 332 and the second reaction subassembly 334B via the guide connectors 338. For example, when the Y movers 330C apply a force to the stages 306 along the Y axis, an equal and opposite force along the Y axis is directly transferred to the guide bars 332 and transferred with the guide connectors 338 to the second reaction subassembly 334B.

Figure 3C:
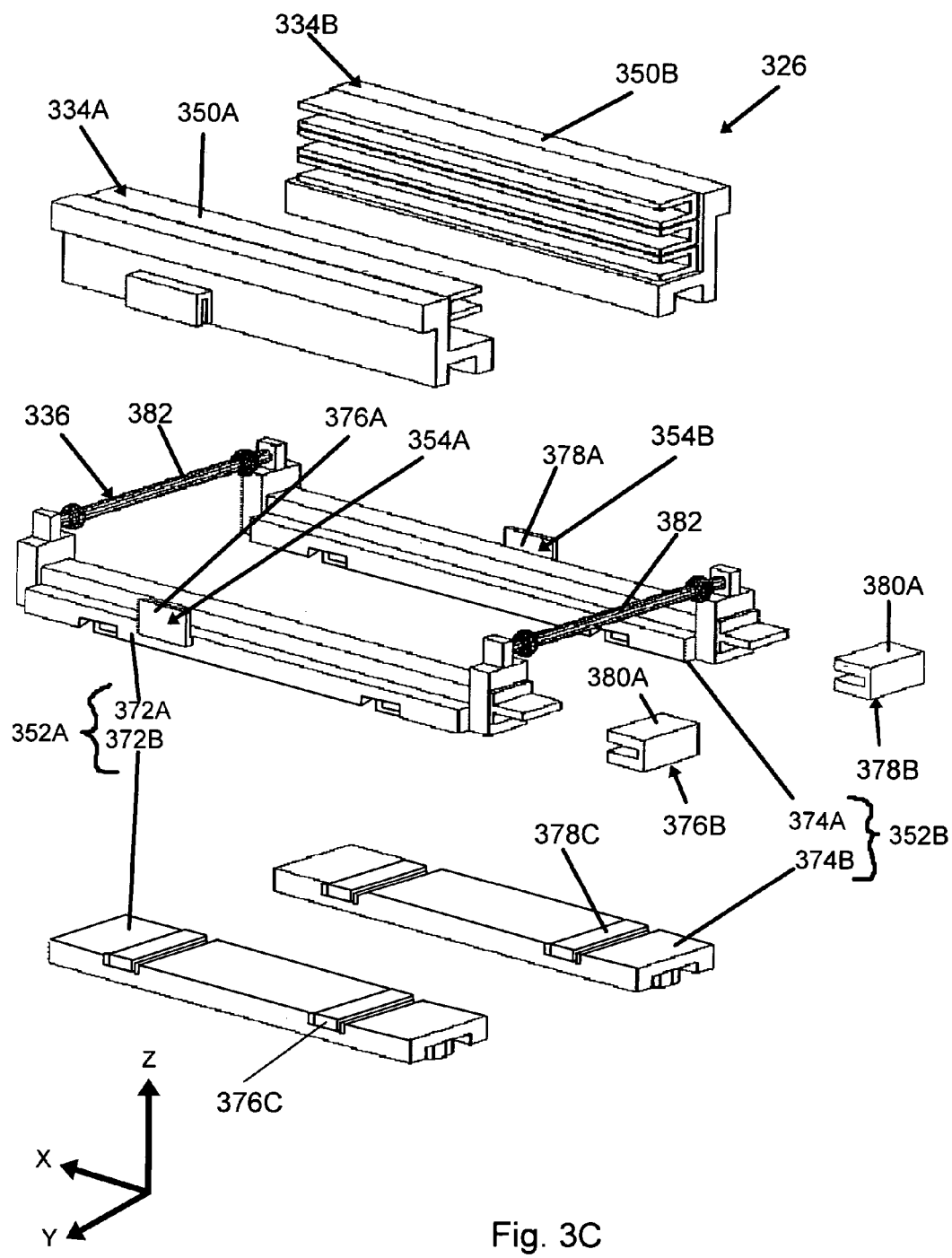
FIG. 3C is an exploded perspective view of a reaction assembly of the stage assembly of FIG. 3A.

FIG. 3C is an exploded perspective view of the reaction assembly 326 of FIG. 3A, including the first reaction subassembly 334A, the second reaction subassembly 334B, and the connector assembly 336. In this embodiment, the first reaction subassembly 334A includes a first mass 350A, a first mass support 352A, and a first trim assembly 354A. Similarly, the second reaction subassembly 334B includes a second mass 350B, a second mass support 352B, and a second trim assembly 354B. In this embodiment, the masses 350A, 350B, are similar to the corresponding components described above.

The first mass support 352A supports the first mass 350A relative to the surface of the mounting area 312 (illustrated in FIG. 3A) and allows for motion of the first mass 350A relative to the mounting area 312 and the stage base 302 (illustrated in FIG. 3A) along the X axis, along the Y axis, and about the Z axis. Somewhat similarly, second mass support 352B supports the second mass 350B relative to the mounting area 312 and allows for motion of the second mass 350B relative to the mounting area 312 and the stage base 302 along the X axis, along the Y axis, and about the Z axis.

In this embodiment, the first trim assembly 354A adjusts and/or resets the position of the first mass 350A along the X axis, along the Y axis, and about the Z axis, cancels any positional errors of the first mass 350A and/or cancels any steady-state velocity of the first mass 350A. Somewhat similarly, the second trim assembly 354B adjusts and/or resets the position of the second mass 350B along the X axis, along the Y axis, and about the Z axis, cancels any positional errors of the second mass 350B and/or cancels any steady-state velocity of the second mass 350B.

In FIG. 3C, (i) the first trim assembly 354A includes a first X mass trim mover 376A that adjusts the position of the first mass 350A along the X axis relative to the first X guide 372A, a first X guide trim mover 376B that adjusts the position of the first X guide 372A relative to the stage base 302 along the X axis, and a pair of spaced apart first Y trim movers 376C that cooperate to adjust the position of the first mass 350A and the first X guide 372A relative to the first Y guide 372B along the Y axis and about the Z axis; and (ii) the second trim assembly 354B includes a second X mass trim mover 378A that adjusts the position of the second mass 350B along the X axis relative to the second X guide 374A, a second X guide trim mover 378B that adjusts the position of the second X guide 374A relative to the stage base 302 along the X axis, and a pair of spaced apart second Y trim movers 378C that cooperate to adjust the position of the second mass 350B and the second X guide 374A relative to the second Y guide 374B along the Y axis and about the Z axis. Additionally, in this embodiment, the stator component 380A of each X guide trim mover 376B, 378B can be secured to the surface of the mounting area 312 (illustrated in FIG. 3A) with a reaction frame (not shown) or another structure.

The connector assembly 336 mechanically connects and couples the reaction subassemblies 334A, 334B and allows for relative motion of at least a portion of the reaction subassemblies 334A, 334B with at least two degrees of freedom and inhibits relative motion of at least a portion of the reaction subassemblies 334A, 334B with at least one degree of freedom. In FIG. 3C, the connector assembly 336 includes a pair of spaced apart connectors 382 that connect the X guides 372A, 374A together. In this embodiment, each connector 382 is similar to the corresponding components described above.

Figure 3D:
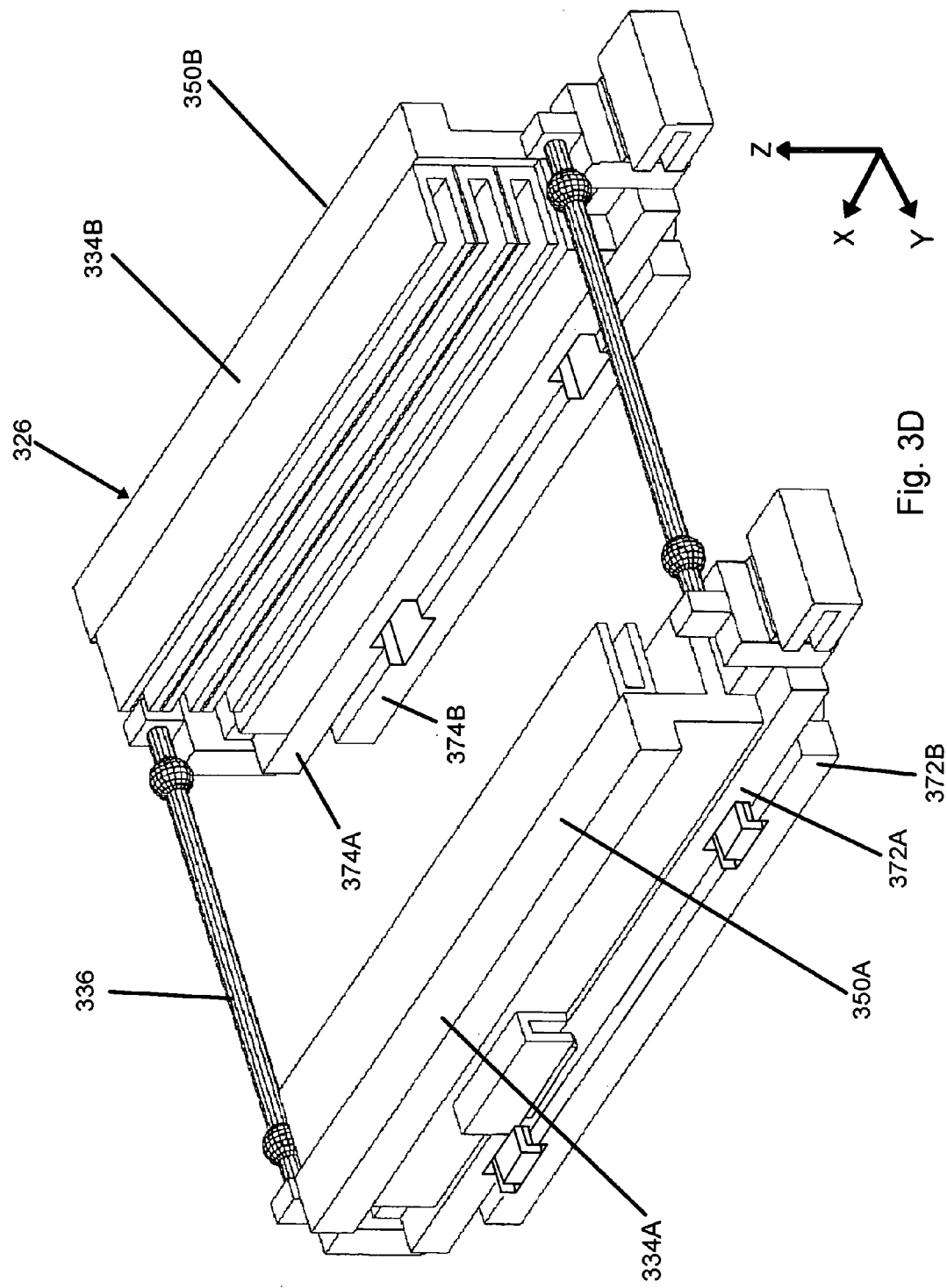
FIG. 3D is a perspective view of the reaction assembly of FIG. 3C.

FIG. 3D is a perspective view of the reaction assembly 326 including the first reaction subassembly 334A, the second reaction subassembly 334B and the connector assembly 336. Through the principle of conservation of momentum, movement of one or both the stages 306 (illustrated in FIG. 3A) and guide bars 332 (illustrated in FIG. 3A) with the X movers 330A, 330B (illustrated in FIG. 3A) along the X axis in one direction, generates an equal but opposite X reaction force that moves the masses 350A, 350B relative to the respective X guides 372A, 374A in the opposite direction along the X axis. Movement of one or both stages 306 with the Y movers 330C (illustrated in FIG. 3A) along the Y axis in one direction creates an equal but opposite Y reaction force on the second mass 350B along the Y axis that moves the masses 350A, 350B and the X guides 372A, 374A along the Y axis relative to the Y guides 372B, 374B. Additionally, movement of one or both stages 306 about the Z axis with the X movers 330A, 330B can generate a theta Z reaction force (torque) about the Z axis in the opposite direction that moves the masses 350A, 350B independently relative to the respective X guides 372A, 374A.

Figure 4A:
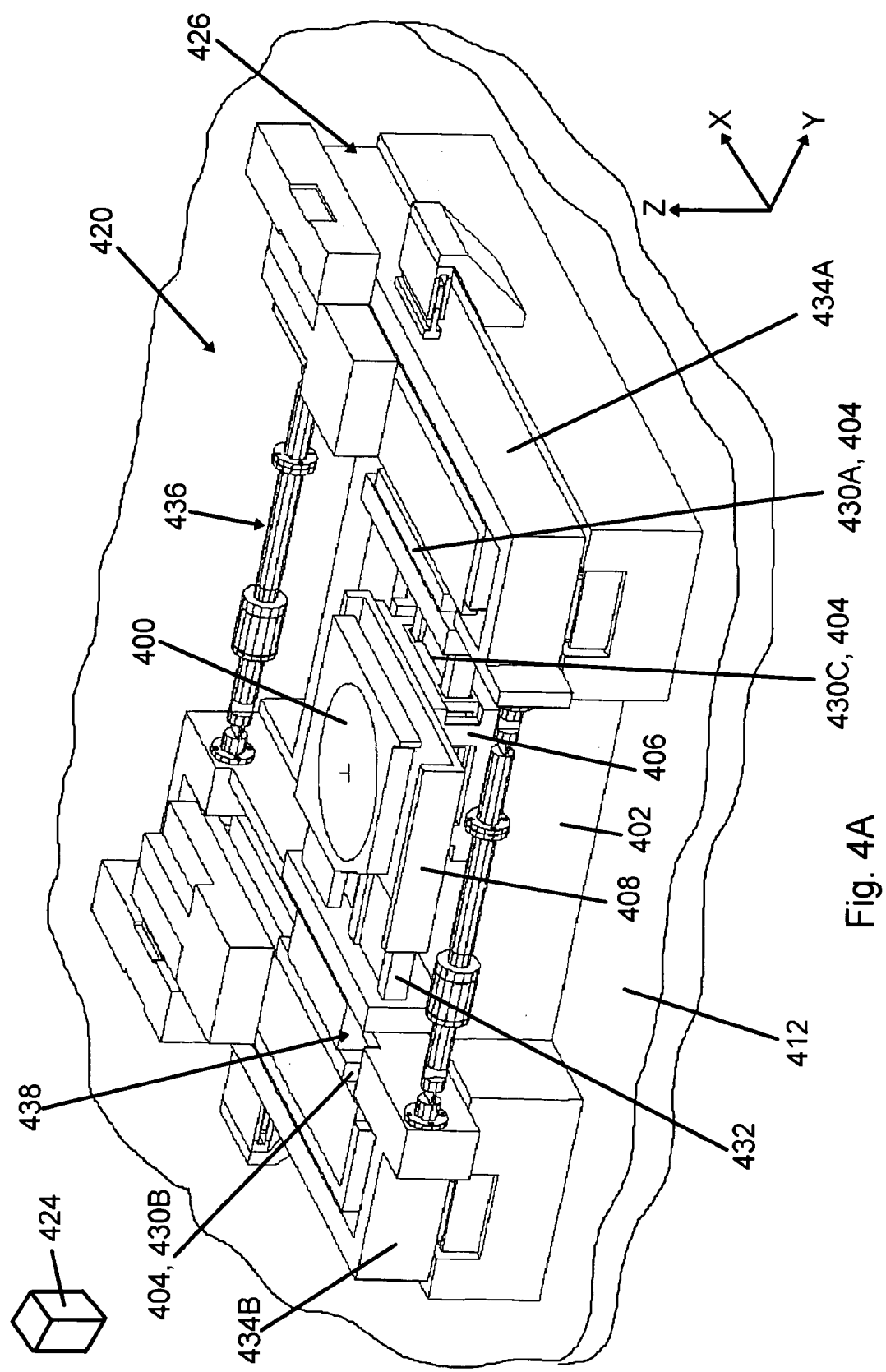
FIG. 4A is a perspective view of a control system and yet another embodiment of a stage assembly having features of the present invention.

FIG. 4A is a perspective view of a control system 424, and another embodiment of a stage assembly 420 that is used to position a device 400 relative to a mounting area 412. For example, the stage assembly 420 can be used as the wafer stage assembly 20 in the exposure apparatus 10 of FIG. 1. Alternatively, the stage assembly 420 can be used to move other types of devices 400 during manufacturing and/or inspection, to move a device under an electron microscope (not shown), or to move a device during a precision measurement operation (not shown).

In FIG. 4A, the stage assembly 420 includes a stage base 402, a stage mover assembly 404, a stage 406, a device table 408, and a reaction assembly 426 that are somewhat similar to the corresponding components described above and illustrated in FIG. 2A.

In FIG. 4A, the stage base 402 is somewhat rectangular shaped. However, in this embodiment, the stage base 402 supports the reaction assembly 426, and some of the other components of the stage assembly 420 above the mounting area 412.

The stage mover assembly 404 controls and moves the stage 406 and the device table 408 relative to the stage base 402. In FIG. 4A, the stage mover assembly 404 includes a first X mover 430A, a second X mover 430B, a guide bar 432, and a Y mover 430C that are similar to the corresponding components illustrated in FIG. 2A.

FIG. 4A illustrates another embodiment of the reaction assembly 426 that reduces the influence of the reaction forces along the X axis, along the Y axis and about the Z axis. In FIG. 4A, the reaction assembly 426 includes a first reaction subassembly 434A, a second reaction subassembly 434B, a connector assembly 436, and a guide connector 438. The connector assembly 436 connects the subassemblies 434A, 434B together. The guide connector 438 couples the guide bar 432 to the second reaction subassembly 434B.

In FIG. 4A, at least a part of each of the subassemblies 434A, 434B moves independently along the X axis and the subassemblies 434A, 434B move concurrently along the Y axis relative to the stage base 402 and the mounting area 412.

In this embodiment, when the movers 430A, 430B, 430C apply a force to the stage 406 along the X axis, the Y axis, and/or about the Z axis, an equal and opposite force is applied to the subassemblies 430A, 430B. Further, the control system 424 corrects the positions of at least a portion of the reaction subassemblies 434A, 434B along the X axis and along the Y axis.

In this embodiment, the first reaction subassembly 434A is positioned on one side of the stage base 402 and the second reaction subassembly 434B is positioned on the opposite side of the stage base 402. The reaction subassemblies 434A, 434B are spaced apart and substantially parallel. In this embodiment, reaction subassemblies 434A, 434B and the stage 406 are supported by the stage base 402.

Figure 4B:
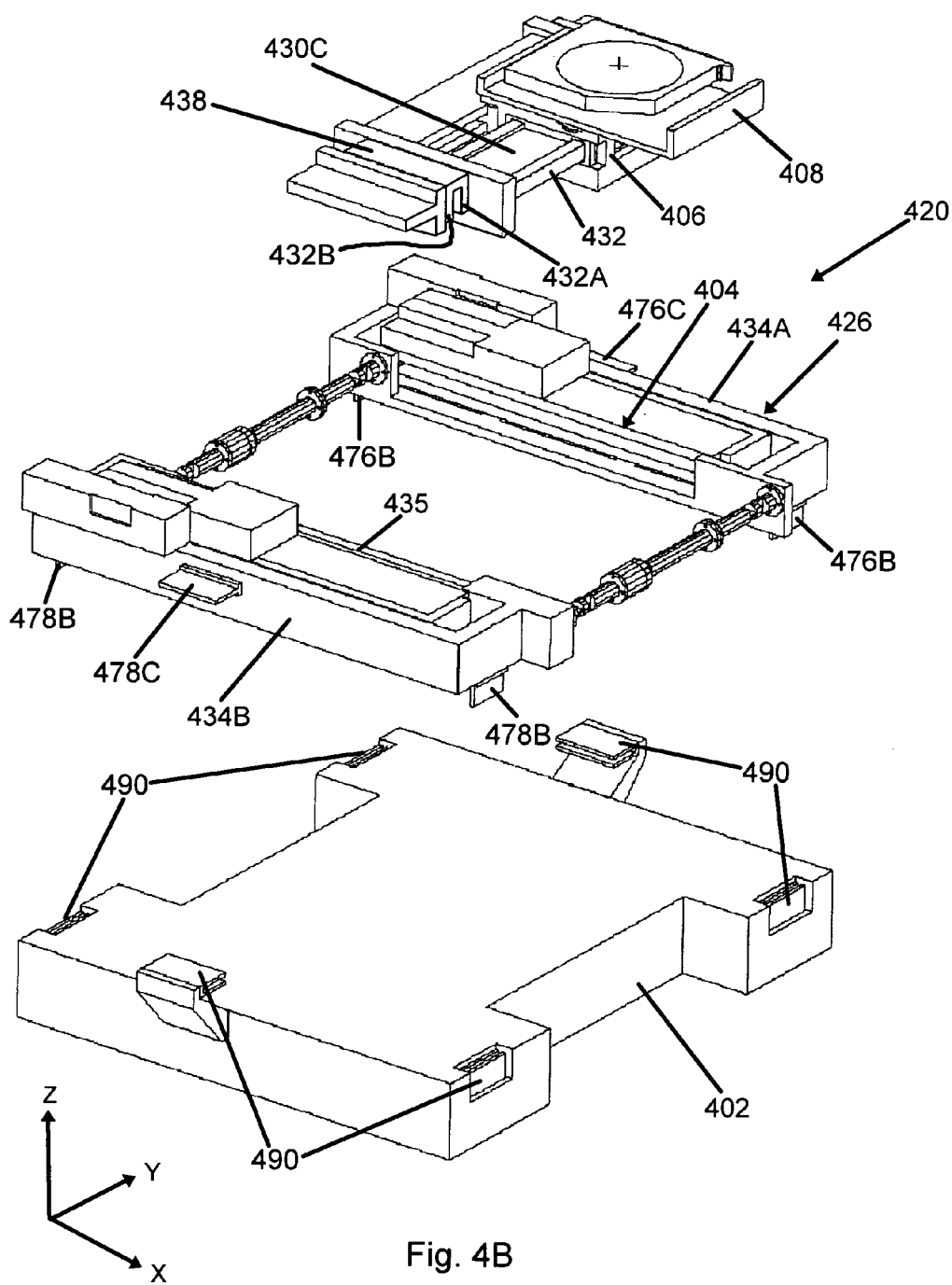
FIG. 4B is an exploded perspective view of the stage assembly of FIG. 4A.

FIG. 4B is an exploded perspective view of the stage assembly 420 of FIG. 4A, including the stage base 402, the stage mover assembly 404, the stage 406, the device table 408, and the reaction assembly 426 of FIG. 4A.

In FIG. 4B, the guide connector 438 connects and couples the guide bar 432 to the reaction assembly 426 and allows for relative movement between the guide bar 432 and the reaction assembly 426.

In FIG. 4B, the left end of the guide bar 432 includes a downwardly extending first bar wall 432A and a spaced apart downwardly extending second bar wall 432B and the second reaction subassembly 434B includes an upwardly extending wall 435 that is positioned between the bar walls 432A, 432B. Further, the guide connector 438 is defined by (i) a fluid bearing that is created between a first bar wall 432A and the wall 435 and (ii) a fluid bearing that is created between the second bar wall 432B and the wall 435. In one embodiment, the air pads (not shown) for each fluid bearing are on a gimbal so that the bearings provide constraint along the Y axis only. With this design, the guide bar 432 is free to move along the X axis and about the Z axis relative to the second reaction subassembly 434B, inhibited from moving along the Y axis relative to the second reaction subassembly 434B, and reaction forces transferred to the guide bar 432 are transferred to the second reaction subassembly 434B. With this design, reaction forces generated by the Y mover 430C are transferred to the guide bar 432 and the second reaction subassembly 434B via the guide connector 438.

In one embodiment, a bearing (not shown) maintains the guide bar 432 spaced apart along the Z axis relative to the stage base 402 and allows for motion of the guide bar 432 along the X axis and about the Z axis relative to the reaction assembly 426 and the stage base 402. The bearing can be a vacuum preload type fluid bearing that maintains the guide bar 432 spaced apart from the stage base 402 in a non-contact manner. Alternatively, for example, a magnetic type bearing or a roller type assembly could be utilized that allows for motion of the guide bar 432 relative to the stage base 402. Still alternatively, a bearing (not shown) could maintain the guide bar 432 spaced apart along the Z axis relative to the reaction assembly 426.

Figure 4C:
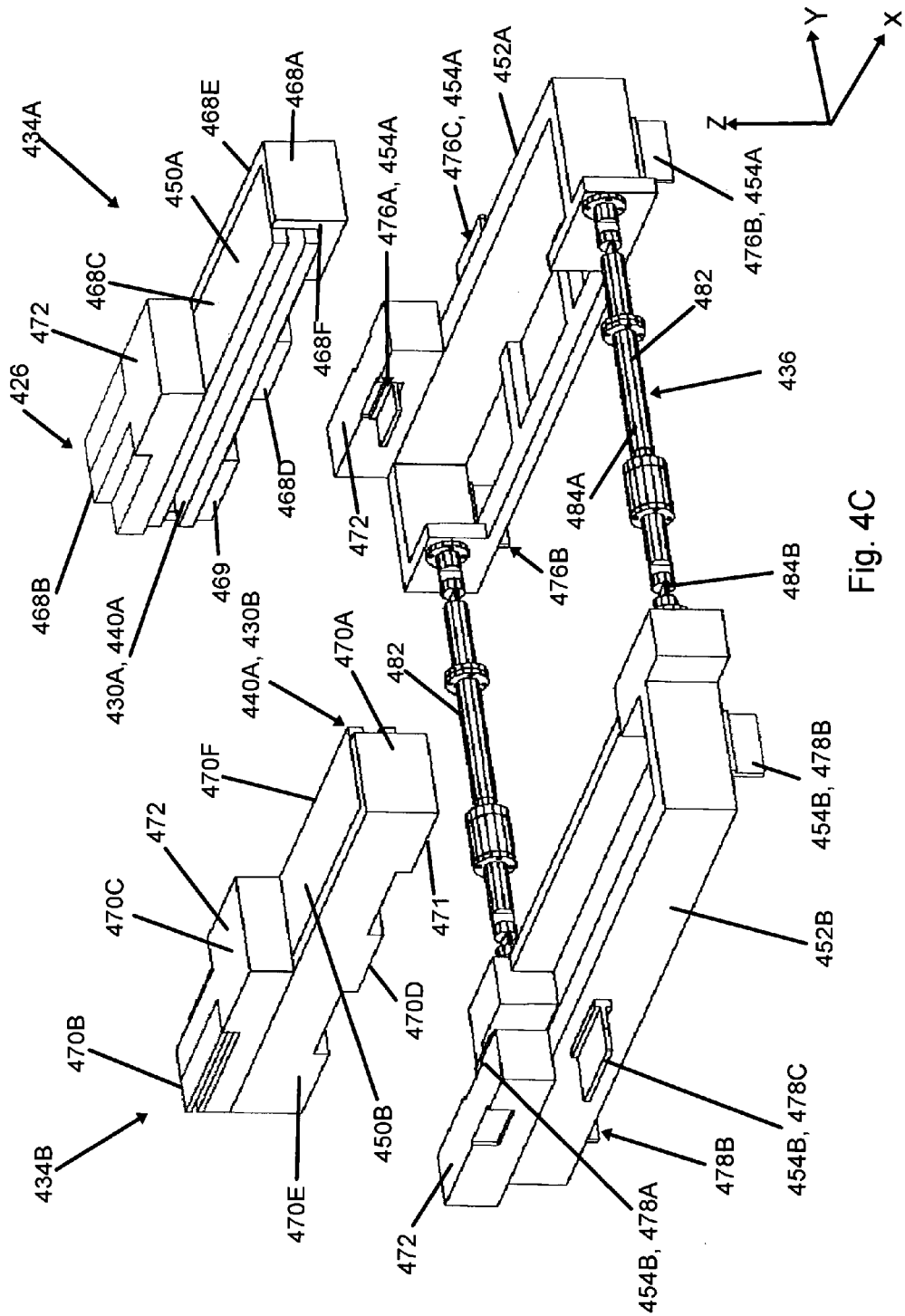
FIG. 4C is an exploded perspective view of a reaction assembly of the stage assembly of FIG. 3A.

FIG. 4C is an exploded perspective view of the reaction assembly 426 of FIG. 4A, including the first reaction subassembly 434A, the second reaction subassembly 434B, and the connector assembly 436. In this embodiment, the first reaction subassembly 434A includes a first mass 450A, a first mass guide 452A, and a first trim assembly 454A. Similarly, the second reaction subassembly 434B includes a second mass 450B, a second mass guide 452B, and a second trim assembly 454B.

In FIG. 4C, the first mass 450A includes a first end 468A, an opposed second end 468B, a top side 468C, an opposed bottom side 468D, an outer side 468E and an opposed inner side 468F. In this embodiment, the first mover component 440A of the first X mover 430A is fixedly secured to the inner side 468F. Additionally, the bottom side 468D of the first mass 450A defines three spaced apart pads 469 that are separated by two rectangular shaped channels that extend along the Y axis in the bottom side 468D.

Similarly, the second mass 450B includes a first end 470A, an opposed second end 470B, a top side 470C, an opposed bottom side 470D, an outer side 470E and an opposed inner side 470F. In this embodiment, the first mover component 440A of the second X mover 430B is fixedly secured to the inner side 470F. Additionally, the bottom side 470D of the second mass 452A defines three spaced apart pads 471 that are separated by two rectangular shaped channels that extend along the Y axis in the bottom side 470D.

The first mass guide 452A guides and allows the first mass 450A to move along the X axis and the first mass guide 452A moves with the first mass 450A along the Y axis. Somewhat similarly, second mass guide 452B guides and allows the second mass 450B to move along the X axis and the second mass guide 452B moves with the second mass 450B along the Y axis.

In one embodiment, the first mass guide 452A is somewhat rectangular frame shaped, allows the first mass 450A to move along the X axis, and restricts movement of the first mass 450A relative to the first mass guide 452A along the Y axis and about the Z axis. Similarly, the second mass guide 452B is somewhat rectangular frame shaped, allows the second mass 450B to move along the X axis, and restricts movement of the second mass 450B relative to the second mass guide 452B along the Y axis and about the Z axis.

A bearing (not shown) allows for motion of the first mass 450A relative to the first mass guide 452A and the stage base 402. In one embodiment, a bearing supports the first mass 450A relative to the stage base 402 and allows the first mass 450A to move relative to the stage base 402. Further, a bearing allows the first mass 450A to move relative to the first mass guide 452A along the X axis and inhibits relative motion along the Y axis. Moreover, a bearing supports the first mass guide 452A relative to the stage base 402 and allows the first mass guide 452A to move relative to the stage base 402 along the Y axis. Each bearing can be a vacuum preload type fluid bearing, magnetic type bearing, or a roller type bearing assembly.

Similarly, a bearing (not shown) allows for motion of the second mass 450B relative to the second mass guide 452B and the stage base 402. In one embodiment, a bearing supports the second mass 450B relative to the stage base 402 and allows the second mass 450B to move relative to the stage base 402. Further, a bearing allows the second mass 450B to move relative to the second mass guide 452B along the X axis and inhibit relative motion along the Y axis. Moreover, a bearing supports the second mass guide 452B relative to the stage base 402 and allows the second mass guide 452B to move relative to the stage base 402 along the Y axis. Each bearing can be a vacuum preload type fluid bearing, magnetic type bearing, or a roller type bearing assembly.

In this embodiment, the first mass 450A and the first mass guide 452A are free to move relative to the stage base 402 along the X axis, along the Y axis, and about the Z axis. Similarly, the second mass 450B and the second mass guide 452B are free to move relative to the stage base 402 along the X axis, along the Y axis, and about the Z axis.

In one embodiment, each of the masses 450A, 450B and each of the mass guides 452A, 452B includes a weighted section 472 that increases the mass and reduces the stroke of the masses 450A, 450B. The weighted sections 472 also raise the height of the center of gravity of the reaction subassemblies 434A, 434B. As an example, each weighted section 472 can be made of steel, lead, tungsten or another relatively dense material.

The first trim assembly 454A adjusts, corrects and/or resets the position of the first mass 450A and the first mass guide 452A along the X axis and the Y axis, cancels any positional errors of the first mass 450A and first mass guide 452A and/or cancels any steady-state velocity of the first mass 450A and the first mass guide 452A. Somewhat similarly, the second trim assembly 454B adjusts and/or resets the position of the second mass 450B and the second mass guide 452B along the X axis and the Y axis, cancels any positional errors of the second mass 450B and the second mass guide 452B and/or cancels any steady-state velocity of the second mass 450B and the second mass guide 452B.

In FIG. 4C, the first trim assembly 454A includes a first X mass mover 476A, a first X guide mover 476C, and two, first Y trim movers 476B, and the second trim assembly 454B includes a second X mass mover 478A, a second X guide mover 478C, and two second Y trim movers 478B. In this embodiment, for the first trim assembly 454A, (i) the first X mass mover 476A adjusts the position of first mass 450A relative to the first mass guide 452A along the X axis, (ii) the first X guide mover 476C adjusts the position of the first mass guide 452A relative to the stage base 402 (illustrated in FIG. 4B) along the X axis, and (iii) the first Y trim movers 476B adjust the position of the first mass 450A and the first mass guide 452A relative to the stage base 402 along the Y axis and about the Z axis. Similarly, for the second trim assembly 454B, (i) the second X mass mover 478A adjusts the position of second mass 450B relative to the second mass guide 452B along the X axis, (ii) the second X guide mover 478C adjusts the position of the second mass guide 452B relative to the stage base 402 along the X axis, (iii) the second Y trim movers 478B adjust the position of the second mass 450B and the second mass guide 452B relative to the stage base 402 along the Y axis and about the Z axis. With regard to the X guide mover 476C, 478C, and the Y trim mover 476B, 478B, each of the stator component 490 of these movers is attached to the stage base 402 as shown in FIG. 4B.

The connector assembly 436 mechanically connects and couples the reaction subassemblies 434A, 434B and allows for relative motion of at least a portion of the reaction subassemblies 434A, 434B with at least two degrees of freedom and inhibits relative motion of at least a portion of the reaction subassemblies 434A, 434B with at least one degree of freedom. For example, in FIG. 4C, the connector assembly 436 allows for relative motion of the masses 450A, 450B along the Z axis, along the X axis, about the X axis, about the Y axis, and about the Z axis and inhibits relative motion of the masses 450A, 450B and the X guides 472A, 474A along the Y axis.

In FIG. 4C, the connector assembly 436 includes a pair of spaced apart connectors 482 that connect the mass guides 452A, 452B together. In one embodiment, each connector 482 is a link that is relatively stiff along one degree of freedom and relatively flexible with five degrees of freedom. In this embodiment, each connector 482 includes a rigid bar 484A and a pair of spaced apart joints 484B, e.g. flexures or ball joints, that allow for motion with five degrees of freedom. Alternatively, the connector assembly 436 can include more than two or less than two connectors 482, or each connector 482 can be a stiff rod.

Figure 4D:
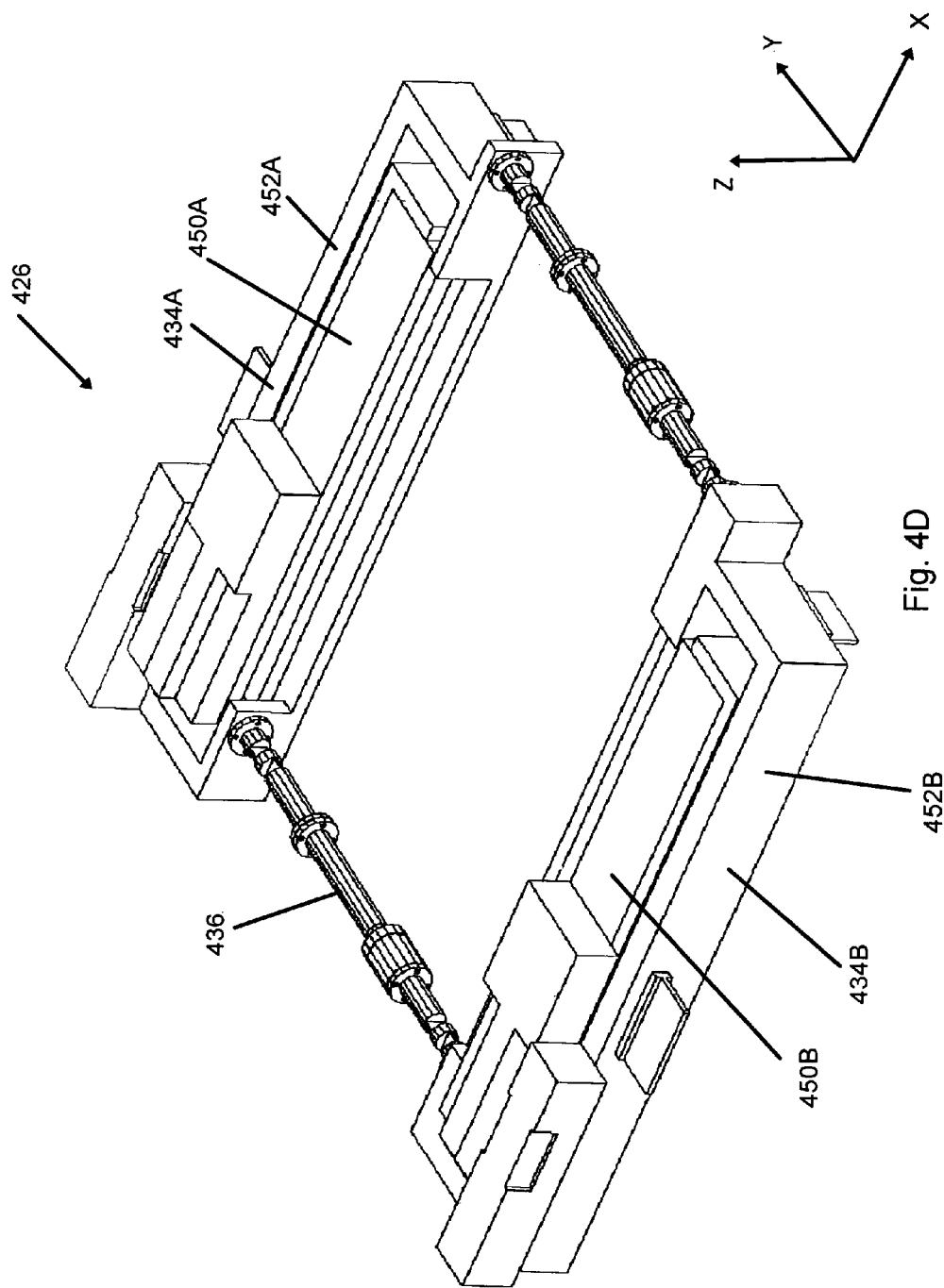
FIG. 4D is a perspective view of the reaction assembly of FIG. 4C.

FIG. 4D is a perspective view of the reaction assembly 426 including the first reaction subassembly 434A, the second reaction subassembly 434B and the connector assembly 436. Through the principle of conservation of momentum, movement of the stage 406 (illustrated in FIG. 4A) and guide bar 432 (illustrated in FIG. 4A) with the X movers 430A, 430B (illustrated in FIG. 4A) along the X axis in one direction, generates an equal but opposite X reaction force that moves the masses 450A, 450B relative to the respective mass guides 452A, 452B in the opposite direction along the X axis. Movement of the stage 406 with the Y mover 430C (illustrated in FIG. 4A) along the Y axis in one direction creates an equal but opposite Y reaction force on the second mass guide 452B along the Y axis that moves the masses 450A, 450B along the Y axis relative to the stage base 402. Additionally, movement of the stage 406 about the Z axis with the X movers 430A, 430B can generate a theta Z reaction force (torque) about the Z axis in the opposite direction that moves the masses 450A, 450B independently relative to the respective mass guides 452A, 452B.

Figure 5A:
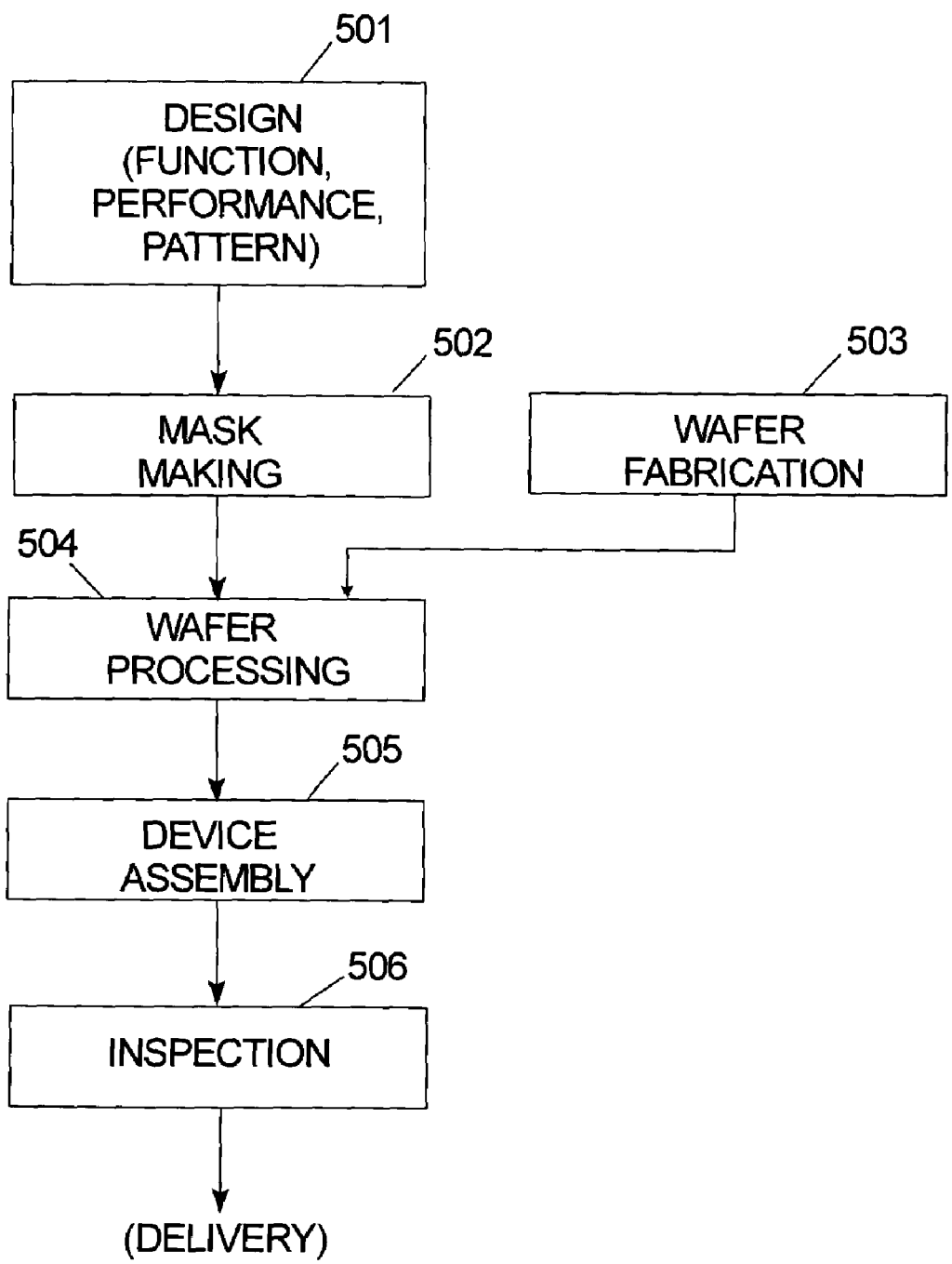
FIG. 5A is a flow chart that outlines a process for manufacturing a device in accordance with the present invention.

Semiconductor devices can be fabricated using the above described systems, by the process shown generally in FIG. 5A. In step 501 the device's function and performance characteristics are designed. Next, in step 502, a mask (reticle) having a pattern is designed according to the previous designing step, and in a parallel step 503 a wafer is made from a silicon material. The mask pattern designed in step 502 is exposed onto the wafer from step 503 in step 504 by a photolithography system described hereinabove in accordance with the present invention. In step 505 the semiconductor device is assembled (including the dicing process, bonding process and packaging process), finally, the device is then inspected in step 506.

Figure 5B:
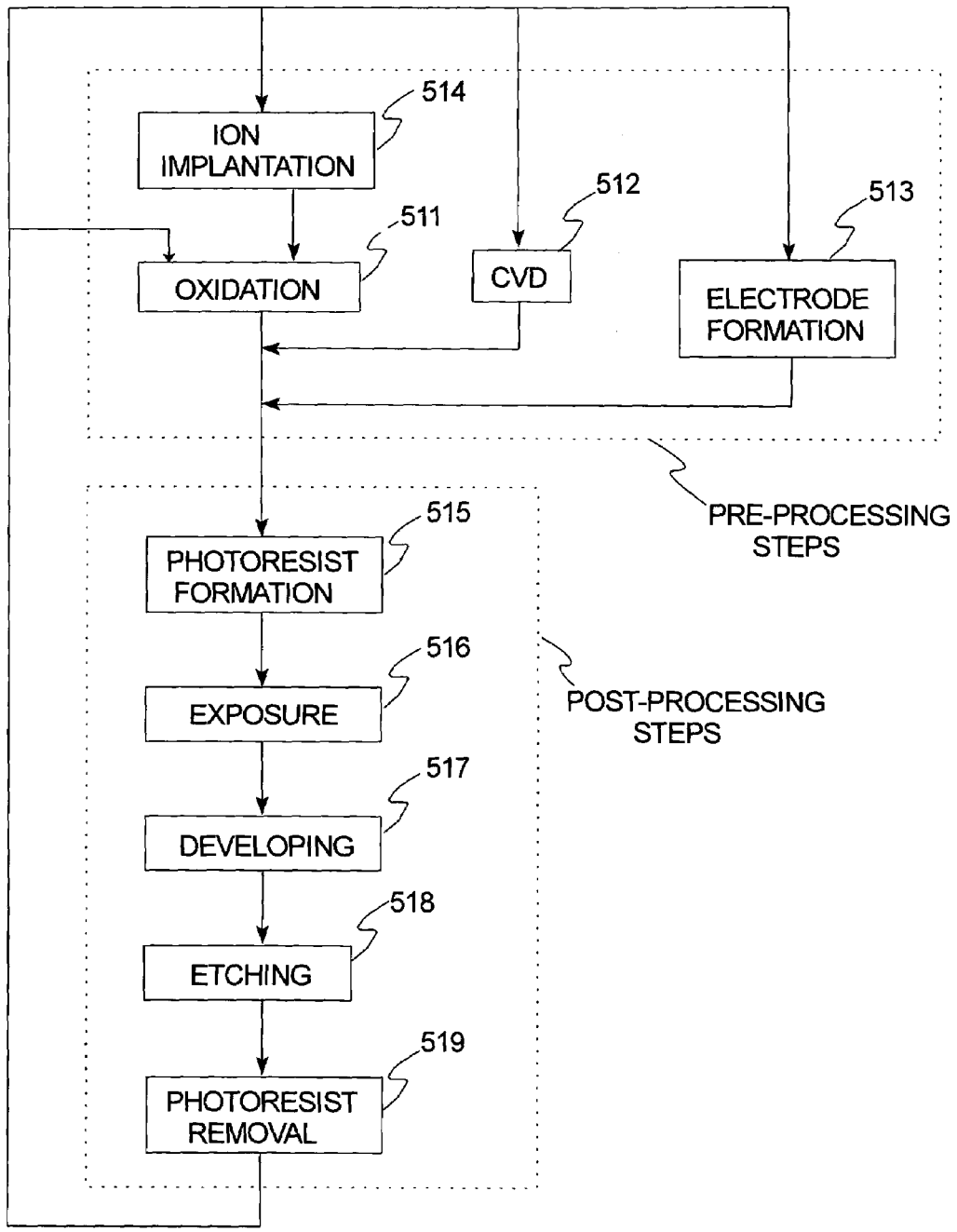
FIG. 5B is a flow chart that outlines device processing in more detail.

FIG. 5B illustrates a detailed flowchart example of the above-mentioned step 504 in the case of fabricating semiconductor devices. In FIG. 5B, in step 511 (oxidation step), the wafer surface is oxidized. In step 512 (CVD step), an insulation film is formed on the wafer surface. In step 513 (electrode formation step), electrodes are formed on the wafer by vapor deposition. In step 514 (ion implantation step), ions are implanted in the wafer. The above mentioned steps 511–514 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 515 (photoresist formation step), photoresist is applied to a wafer. Next, in step 516 (exposure step), the above-mentioned exposure device is used to transfer the circuit pattern of a mask (reticle) to a wafer. Then in step 517 (developing step), the exposed wafer is developed, and in step 518 (etching step), parts other than residual photoresist (exposed material surface) are removed by etching. In step 519 (photoresist removal step), unnecessary photoresist remaining after etching is removed.

Multiple circuit patterns are formed by repetition of these preprocessing and post-processing steps.

While the particular exposure apparatus 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device relative to a mounting area, the stage assembly comprising:

a stage that retains the device;

a stage mover assembly connected to the stage, the stage mover assembly moving the stage along a first axis and generating reaction forces; and a reaction assembly coupled to the stage mover assembly, the reaction assembly including a first reaction subassembly having a first mass that is movable along the first axis, a second reaction subassembly having a second mass that is movable along the first axis, and a connector assembly that connects the reaction subassemblies together, allows for relative movement of the masses with at least one degree of freedom and inhibits relative movement of the masses with at least one degree of freedom.

2. The stage assembly of claim 1 wherein the stage mover assembly moves the stage with two degrees of freedom, the reaction assembly reduces the reaction forces in the two degrees of freedom that are transferred to the mounting area, and the connector assembly allows for relative movement of the masses with at least two degrees of freedom.

3. The stage assembly of claim 2 wherein the stage mover assembly moves the stage along the first axis and along a second axis, the axes being orthogonal to each other, and the connector assembly allows for relative movement of the masses along the first axis and inhibits relative movement of the masses along the second axis.

4. The stage assembly of claim 3 wherein the reaction assembly adjusts the position of the masses along a third axis relative to the mounting area.

5. The stage assembly of claim 4 wherein the reaction assembly independently adjusts the position of the masses along the Z axis.

6. The stage assembly of claim 3 wherein the masses move independently along the first axis and the masses move concurrently along the second axis relative to the mounting area.

7. The stage assembly of claim 6 wherein when the stage mover assembly moves the stage along the first axis in one direction, at least one of the masses moves along the first axis in an opposite direction.

8. The stage assembly of claim 7 wherein when the stage mover assembly moves the stage along the second axis in one direction, the masses move concurrently along the second axis in the opposite direction.

9. The stage assembly of claim 1 wherein the first reaction subassembly includes a first X guide that guides the movement of the first mass along the first axis and a first Y guide that guides the movement of the first mass and the first X guide along a second axis.

10. The stage assembly of claim 9 wherein the first reaction subassembly includes a first trim assembly that adjusts the position of the first mass along the first axis and adjusts the position of the first mass and the first X guide along the second axis.

11. The stage assembly of claim 10 wherein the first trim assembly includes a first X trim mover that adjusts the position of the first mass along the first axis and a Y trim mover that adjusts the position of the first mass and the first X guide along the second axis.

12. The stage assembly of claim 1 wherein the reaction assembly independently adjusts the position of the masses along the first axis.

13. The stage assembly of claim 1 wherein the connector assembly secures the masses together.

14. The stage assembly of claim 1 wherein each reaction subassembly includes an X guide that guides the motion of the respective masses along the first axis and wherein the connector assembly secures the X guides together.

15. The stage assembly of claim 1 wherein the connector assembly includes a pair of spaced apart connectors.

16. The stage assembly of claim 15 wherein at least one of the connectors includes a bar and a joint.

17. The stage assembly of claim 1 further comprising a stage base that supports the stage.

18. The stage assembly of claim 17 further comprising a base isolator that adjusts the position of the stage base relative to the mounting area and the masses.

19. The stage assembly of claim 17 wherein the stage mover assembly includes a guide bar that guides motion of the stage, the guide bar being supported by the reaction assembly independently of the stage base.

20. The stage assembly of claim 17 wherein the stage mover assembly includes a guide bar that guides motion of the stage, the guide bar being supported by the stage base.

21. The stage assembly of claim 17 where the reaction assembly is supported by the stage base.

22. The stage assembly of claim 17 further comprising a subassembly adjuster that independently adjusts the position of the masses relative to the stage base and the mounting area.

23. An exposure apparatus including an irradiation apparatus that is a source of radiation, and the stage assembly of claim 1 that moves the device relative to the irradiation apparatus.

24. A process for manufacturing a device including the steps of providing a substrate and transferring an image onto the substrate with the exposure apparatus of claim 23.

25. A process for manufacturing a wafer including the steps of providing a substrate and transferring an image onto the substrate with the exposure apparatus of claim 23.

26. A method for making a stage assembly that moves a device relative to a mounting area, the method comprising the steps of:
  providing a stage that retains the device;
  connecting a stage mover assembly to the stage, the stage mover assembly moving the stage along a first axis and generating reaction forces; and
  coupling a reaction assembly to the stage mover assembly, the reaction assembly including a first reaction subassembly having a first mass that is movable along the first axis, a second reaction subassembly having a second mass that is movable along the first axis, and a connector assembly that connects the reaction subassemblies together, allows for relative movement of the masses with at least one degree of freedom and inhibits relative movement of the masses with at least one degree of freedom.

27. The method of claim 26 wherein the step of connecting a stage mover assembly includes the step of moving the stage with two degrees of freedom with the stage mover assembly and wherein the step of coupling a reaction assembly includes the step of reducing the reaction forces in the two degrees of freedom that are transferred to the mounting area with the reaction assembly.

28. The method of claim 27 wherein the step of connecting a stage mover assembly includes the step of moving the stage along the first axis and along a second axis with the stage mover assembly, the axes being orthogonal to each other, and wherein the step of coupling a reaction assembly includes the steps of allowing for relative movement of the masses along the first axis and inhibiting relative movement of the masses along the second axis with the connector assembly.

29. The method of claim 28 wherein the step of coupling a reaction assembly includes the step of adjusting the position of the masses along a third axis relative to the mounting area with the reaction assembly.

30. The method of claim 29 wherein the step of coupling a reaction assembly includes the step of adjusting the position of the masses along the third axis with the reaction assembly.

31. The method of claim 28 wherein the step of coupling a reaction assembly includes the masses moving independently along the first axis and the masses moving concurrently along the second axis relative to the mounting area.

32. The method of claim 31 wherein when the step of connecting a stage mover assembly includes the step of moving the stage along the first axis in one direction with the stage mover assembly, and the step of coupling a reaction assembly includes at least one of the masses moving along the first axis in an opposite direction.

33. The method of claim 31 wherein when the step of connecting a stage mover assembly includes the step of moving the stage along the second axis in one direction with the stage mover assembly, and the step of coupling a reaction assembly includes the masses moving concurrently along the second axis in the opposite direction.

34. The method of claim 26 wherein the step of coupling a reaction assembly includes the steps of guiding the movement of the first mass along the first axis with a first X guide and guiding the movement of the first mass and the first X guide along a second axis with a first Y guide.

35. The method of claim 34 wherein the step of coupling a reaction assembly includes the steps of adjusting the position of the first mass along the first axis and adjusting the position of the first mass and the first X guide along the second axis with a first trim assembly.

36. The method of claim 35 wherein the step of coupling a reaction assembly includes the steps of adjusting the position of the first mass along the first axis with a first trim mover of the first trim assembly and adjusting the position of the first mass and the first X guide along the second axis with a Y trim mover of the first trim assembly.

37. The method of claim 26 wherein the step of coupling a reaction assembly includes the step of independently adjusting the position of the masses along the first axis.

38. The method of claim 26 wherein the step of coupling a reaction assembly includes the step of securing the masses together with the connector assembly.

39. The method of claim 26 wherein the step of coupling a reaction assembly includes the steps of guiding the motion of the respective masses along the first axis with an X guide and securing the X guides together with the connector assembly.

40. The method of claim 26 wherein the step of coupling a reaction assembly includes the connector assembly having a pair of spaced apart connectors.

41. The method of claim 40 wherein the step of coupling a reaction assembly includes at least one of the connectors including a bar and a joint.

42. The method of claim 26 further comprising the step of providing a stage base that supports the stage.

43. The method of claim 42 further comprising the step of providing a base isolator that adjusts the position of the stage base relative to the mounting surface and the masses.

44. The method of claim 42 wherein the step of connecting a stage mover assembly includes the step of guiding the motion of the stage with a guide bar, the guide bar being supported by the reaction assembly independently of the stage base.

45. The method of claim 42 wherein the step of connecting a stage mover assembly includes the step of guiding the motion of the stage with a guide bar, the guide bar being supported by the stage base.

46. The method of claim 42 wherein the step of coupling a reaction assembly includes the step of supporting the reaction assembly with the stage base.

47. The method of claim 26 wherein the step of coupling a reaction assembly includes each reaction subassembly including a mass support that allows the masses to move independently along the first axis and allows the masses to move concurrently along the second axis.

48. A method for making an exposure apparatus that forms an image on a wafer, the method comprising the steps of:
   providing an irradiation apparatus that irradiates the wafer with radiation to form the image on the wafer; and
   providing the stage assembly made by the method of claim 26.

49. A method of making a wafer including the steps of providing a substrate and transferring an image onto the substrate with the exposure apparatus made by the method of claim 48.

50. A method of making a device including the steps of providing a substrate and transferring an image onto the substrate with the exposure apparatus made by the method of claim 48.

51. A process for manufacturing a device including the steps of providing a substrate and transferring an image onto the substrate with an exposure apparatus that includes a stage assembly that moves the device relative to a mounting area, the stage assembly comprising: a stage that retains the device; a stage mover assembly connected to the stage, the stage mover assembly moving the stage and generating reaction forces; and a reaction assembly coupled to the stage mover assembly, the reaction assembly including a first reaction subassembly having a first mass, a second reaction subassembly having a second mass, and a connector assembly that connects the reaction subassemblies together, allows for relative movement of the masses with at least one degree of freedom and inhibits relative movement of the masses with at least one degree of freedom.

52. A process for manufacturing a wafer including the steps of providing a substrate and transferring an image onto the substrate with an exposure apparatus that includes a stage assembly that moves a device relative to a mounting area, the stage assembly comprising: a stage that retains the device; a stage mover assembly connected to the stage, the stage mover assembly moving the stage and generating reaction forces; and a reaction assembly coupled to the stage mover assembly, the reaction assembly including a first reaction subassembly having a first mass, a second reaction subassembly having a second mass, and a connector assembly that connects the reaction subassemblies together, allows for relative movement of the masses with at least one degree of freedom and inhibits relative movement of the masses with at least one degree of freedom.

53. A method for making an exposure apparatus that forms an image on a wafer, the method comprising the steps of:
   providing an irradiation apparatus that irradiates the wafer with radiation to form the image on the wafer; and
   making a stage assembly that moves the wafer relative to a mounting area, the method comprising the steps of: providing a stage that retains the wafer; connecting a stage mover assembly to the stage, the stage mover assembly moving the stage and generating reaction forces; and coupling a reaction assembly to the stage mover assembly, the reaction assembly including a first reaction subassembly having a first mass, a second reaction subassembly having a second mass, and a connector assembly that connects the reaction subassemblies together, allows for relative movement of the masses with at least one degree of freedom and inhibits relative movement of the masses with at least one degree of freedom.

54. A method of making a wafer including the steps of providing a substrate and transferring an image onto the substrate with the exposure apparatus made by the method of claim 53.

55. A method of making a device including the steps of providing a substrate and transferring an image onto the substrate with the exposure apparatus made by the method of claim 53.

* * * * *